(12) United States Patent
Bae et al.

(10) Patent No.: US 8,199,035 B2
(45) Date of Patent: *Jun. 12, 2012

(54) METHOD, DEVICE, AND SYSTEM FOR DATA COMMUNICATION WITH PREAMBLE FOR REDUCED SWITCHING NOISE

(75) Inventors: Seung-Jun Bae, Hwaseong-si (KR);
Kwang-Chol Choe, Seoul (KR);
Se-Won Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/069,259

(22) Filed: Mar. 22, 2011

(65) Prior Publication Data

US 2011/0170620 A1    Jul. 14, 2011

Related U.S. Application Data

(63) Continuation of application No. 12/655,624, filed on Jan. 4, 2010, now Pat. No. 7,936,289, which is a continuation-in-part of application No. 12/367,134, filed on Feb. 6, 2009, now Pat. No. 7,768,429, which is a continuation of application No. 11/693,264, filed on Mar. 29, 2007, now Pat. No. 7,492,288.

(30) Foreign Application Priority Data

Apr. 4, 2006  (KR) .......................... 10-2006-0030752
Aug. 12, 2009 (KR) .......................... 10-2009-0074204

(51) Int. Cl.
*H03M 7/00* (2006.01)
(52) U.S. Cl. ................................. 341/50; 341/51; 341/58
(58) Field of Classification Search .................... 341/50, 341/51, 58; 370/349; 360/51
See application file for complete search history.

(56) References Cited

U.S. PATENT DOCUMENTS

| | | | |
|---|---|---|---|
| 6,222,792 B1 * | 4/2001 | Hanzawa et al. | 365/233.11 |
| 6,819,599 B2 * | 11/2004 | Schaefer | 365/189.07 |
| 7,170,818 B2 * | 1/2007 | Kyung | 365/189.15 |
| 7,284,169 B2 * | 10/2007 | LaBerge et al. | 714/718 |
| 7,457,192 B2 * | 11/2008 | Kyung | 365/233.12 |
| 7,492,288 B2 * | 2/2009 | Bae et al. | 341/58 |
| 2004/0170157 A1 * | 9/2004 | Kim et al. | 370/349 |
| 2004/0179287 A1 * | 9/2004 | Sawada et al. | 360/51 |

* cited by examiner

*Primary Examiner* — Jean B Jeanglaude
(74) *Attorney, Agent, or Firm* — Monica H. Choi

(57) ABSTRACT

A data communication device or system includes a preamble unit and a data interface. The preamble unit generates or detects a first preamble having a first length for a first data line, and generates or detects a second preamble having a second length for a second data line. The first length is different from the second length, and data on the first and second data lines form parallel data. The data interface communicates a first data with the first preamble via the first data line and communicates a second data with the second preamble via the second data line. The respective length and/or respective pattern of each preamble are adjustable and/or programmable.

10 Claims, 34 Drawing Sheets

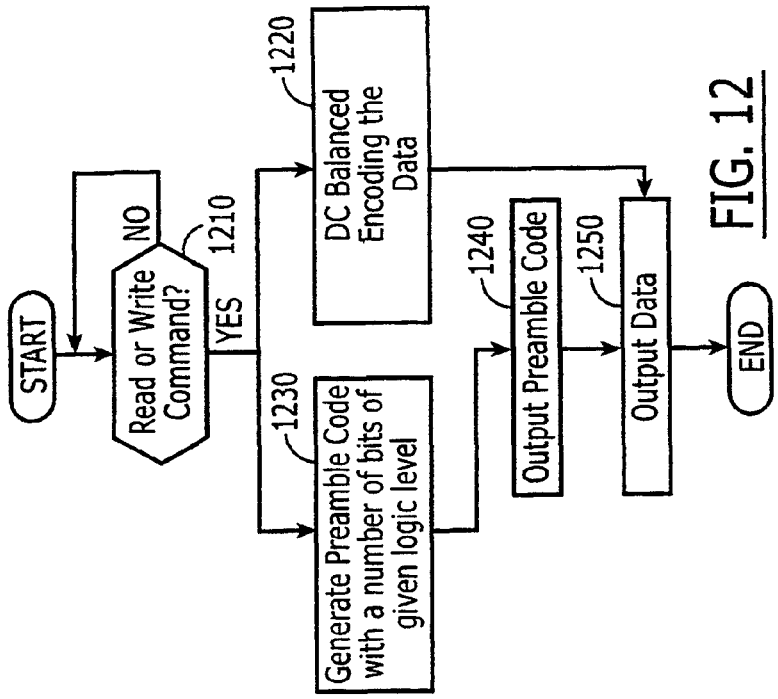
FIG. 12
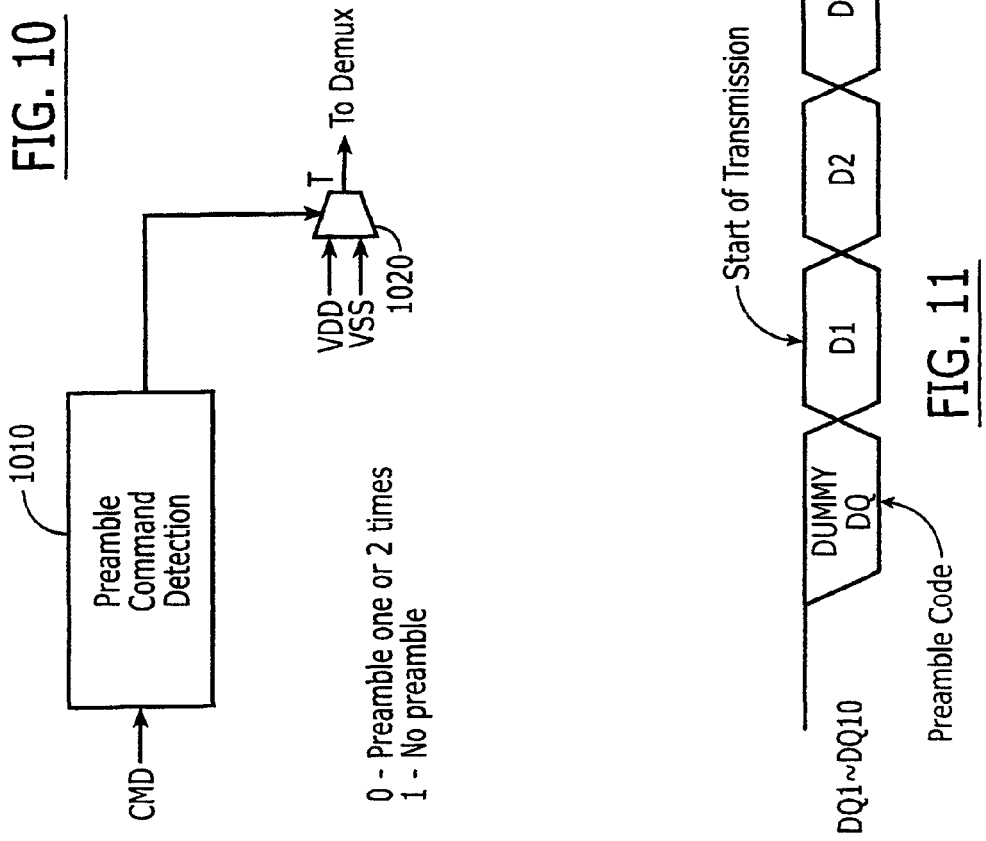
FIG. 10
FIG. 11

FIG. 19A

|  | Idle | Preamble |  |
|---|---|---|---|
| DQ1 | 1111 | 1010 1010 | P_DQ1 |
| DQ2 | 1111 | 0101 1111 | P_DQ2 |
| DQ3 | 1111 | 1010 0101 | P_DQ3 |
| DQ4 | 1111 | 0101 1100 | P_DQ4 |
| DQ5 | 1111 | 1010 0011 | P_DQ5 |
| DQ6 | 1111 | 0101 1110 | P_DQ6 |
| DQ7 | 1111 | 1010 1010 | P_DQ7 |
| DQ8 | 1111 | 0101 1011 | P_DQ8 |
| DBI | 1111 | 0101 1100 | P_DBI |
| Max 0's | 0000 | 5454 2435 | |

Burst Data

| Byte 1 | Byte 2 | Byte 3 | Byte 4 | Byte 5 | Byte 6 | Byte 7 | Byte 8 |
|---|---|---|---|---|---|---|---|
| 4 | 4 | 4 | 4 | 4 | 4 | 4 | 4 |

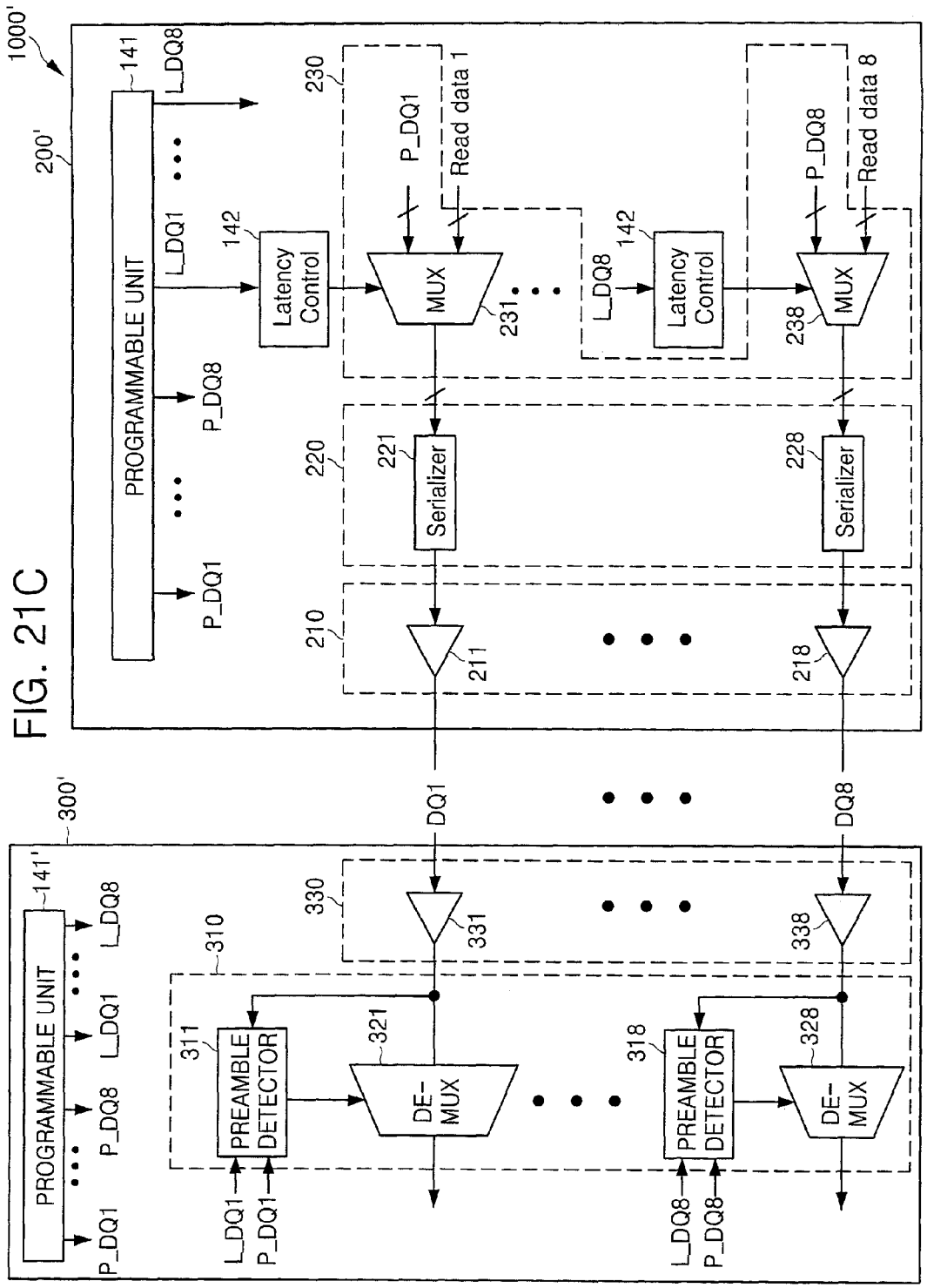

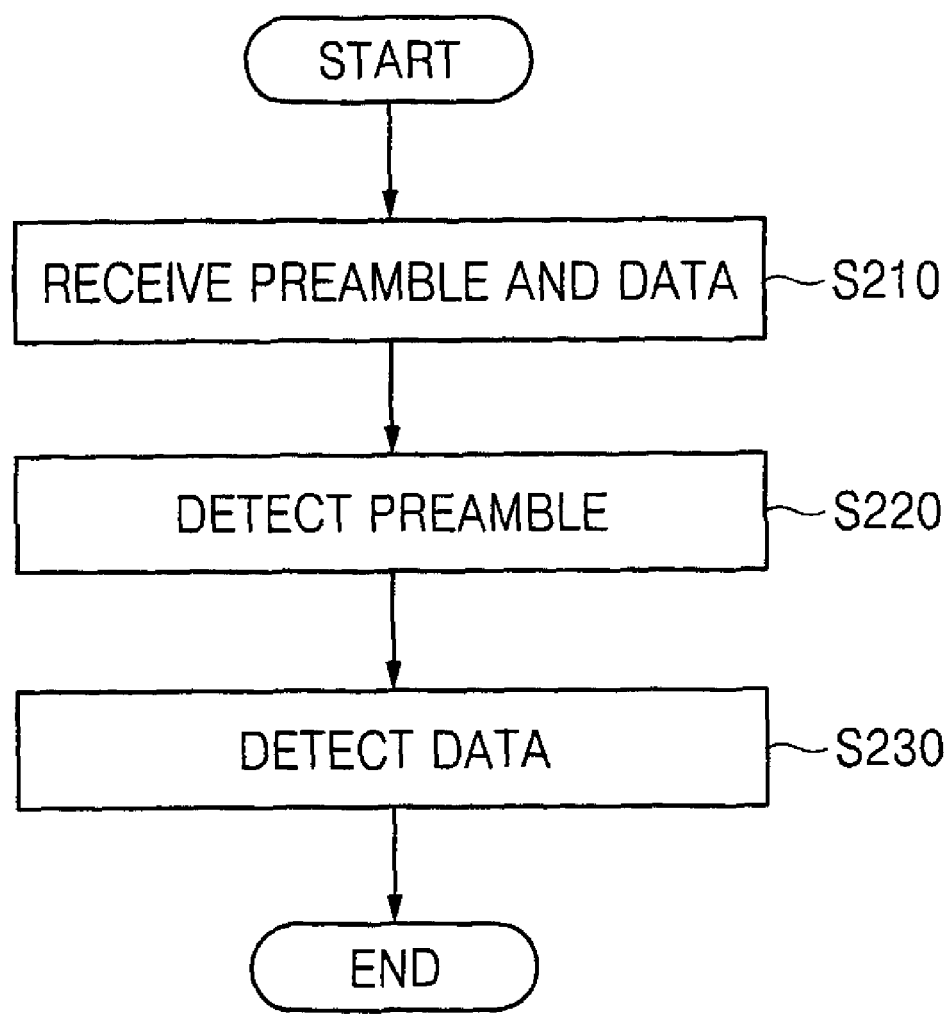

METHOD, DEVICE, AND SYSTEM FOR DATA COMMUNICATION WITH PREAMBLE FOR REDUCED SWITCHING NOISE

CROSS REFERENCE

The present application is a continuation of an earlier filed patent application with Ser. No. 12/655,624 filed on Jan. 4, 2010, now U.S. Pat. No. 7,936,289, for which priority is claimed. This earlier filed patent application with Ser. No. 12/655,624 is in its entirety incorporated herewith by reference.

The earlier filed patent application with Ser. No. 12/655,624 is a CIP (continuation in part) of an earlier filed patent application with Ser. No. 12/367,134 filed on Feb. 6, 2009, now U.S. Pat. No. 7,768,429, for which priority is claimed. This earlier filed patent application with Ser. No. 12/367,134 is in its entirety incorporated herewith by reference.

The patent application with Ser. No. 12/367,134 is a continuing application of patent application with Ser. No. 11/693,264 filed on Mar. 29, 2007 and now issued as U.S. Pat. No. 7,492,288.

The patent application with Ser. No. 12/367,134 and U.S. Pat. No. 7,492,288 claim priority under 35 USC §119 to Korean Patent Application No. 10-2006-0030752, filed on Apr. 4, 2006, in the Korean Intellectual Property Office, the disclosure of which is incorporated herein in its entirety by reference. A certified copy of Korean Patent Application No. 10-2006-0030752 was submitted for U.S. Pat. No. 7,492,288.

The present application also claims priority under 35 USC §119 to Korean Patent Application No. 10-2009-0074204, filed on Aug. 12, 2009, in the Korean Intellectual Property Office, the disclosure of which is incorporated herein in its entirety by reference. A certified copy of Korean Patent Application No. 10-2009-0074204 is contained in the parent copending patent application with Ser. No. 12/655,624.

FIELD OF THE INVENTION

The present invention relates generally to data communications, and more particularly to transmitting and receiving data with a preamble that is programmable with flexible pattern and length.

BACKGROUND OF THE INVENTION

Data transmitting and receiving systems and methods are increasingly used to transmit increasing amounts of data at increasingly higher speeds. In data transmitting/receiving systems and methods, it may be desirable to encode (or code) the data to facilitate transmission and to later decode the encoded data that is received. One type of coding that is widely used is DC balance coding. As is well known to those having skill in the art, DC balance coding is a technique for coding data to provide enough state changes for reasonable clock recovery while achieving DC balance and bounded disparity among adjacent data symbols.

One widely used form of DC balance coding is referred to as "8B/10B coding". As the scheme name suggests, in 8B/10B encoding, eight bits of data are transmitted as a 10-bit entity, often called a symbol or character. The least significant five bits of data are encoded into a 6-bit group, and the most significant three bits are encoded into a 4-bit group. These code groups are concatenated together to form the 10-bit symbol that is transmitted. Because 8B/10B encoding uses 10-bit symbols to encode 8-bit words, each of the 256 possible 8-bit words can be encoded in two different ways, one the bitwise inverse of the other. Using these alternative encodings, the scheme is able to effect long term DC balance. The 8B/10B encoding may be used in IEEE 1394b, Gigabit Ethernet, audio storage devices such as digital audio tape, and other widely used interfaces/devices.

8B/10B DC balance encoding is described in U.S. Pat. No. 4,486,739 to Franaszek et al., entitled "Byte Oriented DC Balanced (0,4) 8B/10B Partitioned Block Transmission Code". As stated in the Abstract of the Franaszek et al. patent, a binary DC balanced code and an encoder circuit for effecting same is described, which translates an eight bit byte of information into ten binary digits for transmission over electromagnetic or optical transmission lines subject to timing and low frequency constraints. The significance of this code is that it combines a low circuit count for implementation with excellent performance near the theoretical limits, when measured with the commonly accepted criteria. The 8B/10B coder is partitioned into a 5B/6B plus a 3B/4B coder. The input code points are assigned to the output code points so the number of bit changes required for translation is minimized and can be grouped into a few classes.

Another example of 8B/10B encoding is described in U.S. Pat. No. 5,387,911 to Gleichert et al., entitled "Method and Apparatus for Transmitting and Receiving Both 8B/10B Code and 10B/12B Code in a Switchable 8B/10B Transmitter and Receiver". As stated in the Abstract of Gleichert et al., a method and apparatus are provided for using a modified 8B/10B system for transmitting 10-bit wide data packets in 12-bit code in which 5B/6B encoder/decoders separate the 10-bit wide data into two 5-bit nibbles. Unique special codes are provided which are not capable of aliasing with other 12-bit code words to provide reliable byte boundaries.

FIG. 1 is a reproduction of FIG. 1 of U.S. Pat. No. 5,387,911 to Gleichert et al. As stated in Gleichert et al., at the top of Column 6, FIG. 1 is a block diagram of a prior art 8B wide architecture of both an 8B/10B transmitter 1 and receiver 2. A latch 4 and encoder 5 of transmitter 1 are configured to accept only 8-bit wide raw data and the encoder 5 was configured to convert the 8-bit raw data into 10-bit parallel code, which is then converted to serial data in shifter 7 and sent over transmission link 8 to the receiver 2. The receiver is also constrained to 8-bit architecture after the decoding of the 10-bit code in decoder 11.

FIG. 2A is a circuit diagram of a conventional data transmitting/receiving system, also referred to as an interface system 10, which includes a transmitter unit 20 and a receiver unit 30. Data bits DQ1 ... DQN are applied to drivers D1-DN, to drive a plurality of signal or transmission lines Line1-LineN. At the receiver unit 30, a plurality of input buffers A1-AN may include termination resistors R1-RN that may be connected to a power supply voltage VDD. A reference voltage may also be applied to the input buffers A1-AN. The reference voltage may be generated by one or more resistors that are tied between the power supply voltage VDD and a ground voltage VSS, or using other conventional techniques. Internal power supply voltages and ground voltages are designated in FIG. 2A by VDDQ and VSSQ, respectively.

As also shown in FIG. 2A, parasitic inductances L1-L4 may exist in the interface system 10. These and/or other parasitic inductances may create Simultaneous Switching Noise (SSN) by creating a current path, as shown by the dotted line labeled IDQ '0' in FIG. 2A, when transmitting a logic level ZERO. Thus, as shown in FIG. 2A, the drivers D1-DN are inverters. When the data is ONE, there may be no parasitic current path created. However, when the data is ZERO, a current path IDQ '0' is created through the transmission lines Line1-LineN. According to the data level, the total current consumption of the drivers may thereby vary, which can create SSN. The parasitic inductances L1-L4 cause the noise (jitter) and may reduce the voltage margin and/or time margin of the data signal. The noise may also degrade the data frequency and/or system performance. SSN may also be created in an interface 10' of FIG. 2B when the terminating resistors R1-RN of the receiver unit 30' are tied to ground (VSS), when the data is ONE, as shown by the dotted line IDQ '1'. Since the SSN may be caused by parasitic inductors, the SSN may also be referred to as L(di/dt) Noise.

DC balance coding can reduce the above-described SSN. In particular, as shown in FIG. 3A, a large current variation in VSSQ may be caused during data transmission of 8-bit parallel data that is not DC balance coded. For example, as shown in FIG. 3A, data words D1-D4 of data bits DQ1-DQ8 are serially transmitted in what may also be referred to as a read/write operation. As between any two adjacent words, the difference in data bits may be up to eight (a transition from all ZEROs to all ONEs, or vice versa), as shown by the current variations of 8IDQ in FIG. 3A. These current variations can create large SSN or L(di/dt) Noise as shown in FIG. 3A. It will be understood by those having skill in the art that, in FIG. 3A, the terminology XIDQ, where X=0 . . . 8, indicates the numbers of ZEROs or ONEs in the 8-bit word. Thus, 3IDQ indicates three ZEROs and five ONEs (or vice versa), and 8IDQ indicates eight ZEROs and no ONEs (or vice versa).

FIG. 3B illustrates DC balance coding using 8B/10B coding schemes, wherein the minimum number of ONEs in a given word is 4, and the maximum number of ONEs in a given word is 6. Thus, as shown in FIG. 3B, an 8B/10B DC balance coded word includes 10 bits, where the number of ONEs is 4, 5 or 6, and the corresponding number of ZEROs is 6, 5 or 4. By reducing the current variation between adjacent words of 8B/10B DC balance coded data, L(di/dt) noise or SSN may be reduced.

Accordingly, DC balance encoding, such as 8B/10B DC balance encoding, can reduce simultaneous switching noise that is caused by parasitic inductances, to thereby allow high speed transmission. Nonetheless, as transmission speeds continue to increase, it may be desirable to further reduce simultaneous switching noise, even when using DC balance coding systems and methods, such as 8B/10B DC balance coding systems and methods.

In addition, the L(di/dt) noise (i.e., simultaneous switching noise) limits the transmission speed and thus the transmission frequency by reducing the voltage and time margin of a signal. To reduce such noise and indicate the start of data, as illustrated in FIG. 2B, the preamble that is a dummy data is used for a semiconductor memory device. The strength and/or pattern of such noise varies according to operating conditions such as an operation frequency, a transmission speed, or a board of the semiconductor memory device. Thus, when a preamble with a fixed value is used, the L(di/dt) noise is difficult to reduce effectively.

SUMMARY OF THE INVENTION

Accordingly, data is communicated with a preamble that is flexibly generated for effectively reducing simultaneous switching noise according to an aspect of the present invention.

A data communication device according to an aspect of the present invention includes a preamble unit and a data interface. The preamble unit generates or detects a first preamble having a first length for a first data line, and generates or detects a second preamble having a second length for a second data line. The first length is different from the second length, and data on the first and second data lines form parallel data. The data interface communicates a first data with the first preamble via the first data line and communicates a second data with the second preamble via the second data line.

In an example embodiment of the present invention, the preamble unit is a preamble generator in a transmitter. In that case, the data interface includes a data output circuit that transmits the first preamble before the first data via the first data line, and transmits the second preamble before the second data via the second data line. In addition, the data communication device further includes a data storage unit and a programmable unit. The data storage unit generates the first and second data, and the programmable unit has the first and second lengths stored therein.

In a further example embodiment of the present invention, the preamble unit is a preamble detector in a receiver for detecting the first and second preambles. In that case, the data interface includes a data input circuit for receiving the first data with the first preamble via the first data line and the second data with the second preamble via the second data line. In addition, the data communication device further includes a data storage unit and a programmable unit. The data storage unit has first and second data written therein, and the programmable unit has the first and second lengths stored therein.

In an example embodiment of the present invention, the first and second lengths are programmed into a programmable unit that is one of a MRS (mode register set) or a programmable fuse circuit.

According to another embodiment of the present invention, the first length is a first number of bits that is different from a second number of bits for the second length. Furthermore, the first preamble has a first pattern different from a second pattern of the second preamble.

In a further embodiment of the present invention, the preamble unit generates or detects a respective preamble with the first length for each of a first group of data lines. Additionally, the preamble unit generates or detects a respective preamble with the second length for each of a second group of data lines. Data on the first and second groups of data lines form parallel data.

A data communication device according to another aspect of the present invention includes a programmable unit, a preamble unit, and a data interface. The programmable unit is configured to be programmed with first preamble information for a first data line and second preamble information for a second data line. The preamble unit generates or detects a first preamble according to the first preamble information.

The preamble unit generates or detects a second preamble according to the second preamble information. The data interface communicates first data with the first preamble via the first data line and communicates second data with the second preamble via the second data line. The first and second data on the first and second data lines form parallel data.

In an example embodiment of the present invention, the data communication device is a transmitter, and the preamble unit is a preamble generator for generating the first and second preambles according to the first and second preamble information that indicates at least one of a respective length and a respective pattern of the first and second preambles. In that case, the data interface includes a data output circuit for transmitting the first and second preamble before the first and second data via the first and second data lines, respectively, after reading the data from a data storage unit.

In another embodiment of the present invention, the data communication device is a receiver, and the data interface includes a data input circuit for receiving the first and second preambles and the first and second data via the first and second data lines, respectively. The preamble unit includes a preamble detector for detecting the first and second preambles according to the first and second preamble information that indicates at least one of respective length and respective pattern of the first and second preambles.

In a further embodiment of the present invention, the first and second preamble information are programmed into the programmable unit that is one of a MRS (mode register set) or a programmable fuse circuit.

A data communication system according to another aspect of the present invention includes a plurality of data lines, a transmitter, and a receiver. The transmitter generates data to be transmitted via the data lines. The receiver receives the data transmitted via the data lines. In addition, at least one of the transmitter and receiver includes a preamble unit and a data interface.

The preamble unit generates or detects a first preamble having a first length for a first data line, and generates or detects a second preamble having a second length for a second data line. The first length is different from the second length, and data on the first and second data lines form parallel data. The data interface communicates a first data with the first preamble via the first data line and communicates a second data with the second preamble via the second data line.

In another embodiment of the present invention, the data interface when within the transmitter includes a data aligner, and the data communication system further includes a data storage unit, and a programmable unit. The data aligner transmits the first preamble before the first data via the first data line, and transmits the second preamble before the second data via the second data line. The data storage unit generates the first and second data, and the programmable unit has the first and second lengths stored therein.

In a further embodiment of the present invention, the data interface when within the receiver includes a data buffer unit and preamble detector. The data buffer unit receives the first data with the first preamble via the first data line and the second data with the second preamble via the second data line. The preamble detector detects the first and second data from the first and second preambles. In that case also, the data communication system further includes a data storage unit for having the first and second data written therein, and includes a programmable unit having the first and second lengths stored therein.

In another embodiment of the present invention, the first length is a first number of bits that is different from a second number of bits for the second length, and the first preamble has a first pattern different from a second pattern of the second preamble.

In a further embodiment of the present invention, the preamble unit generates or detects a respective preamble with the first length for each of a first group of data lines, and generates or detects a respective preamble with the second length for each of a second group of data lines. The data on the first and second groups of data lines form parallel data.

A data communication system according to another aspect of the present invention includes data lines, a transmitter, a receiver, a programmable unit, and a data interface. The transmitter generates first and second data to be transmitted via the data lines. The receiver receives the first and second data transmitted via the data lines. The programmable unit is configured to be programmed with first preamble information for a first data line and second preamble information for a second data line.

The preamble unit generates or detects a first preamble according to the first preamble information and generates or detects a second preamble according to the second preamble information. The data interface communicates first data with the first preamble via the first data line and communicates second data with the second preamble via the second data line. The first and second data on the first and second data lines form parallel data.

In an example embodiment of the present invention, the preamble unit when within the transmitter includes a preamble generator for generating the first and second preambles according to the first and second preamble information that indicates at least one of a respective length and a respective pattern of the first and second preambles. The data interface includes a data aligner for transmitting the first preamble before the first data via the first data line and the second preamble before the second data via the second data line.

In a further embodiment of the present invention, the data interface when within the receiver includes a data buffer for receiving the first preamble before the first data via the first data line and the second preamble before the second data via the second data line. The preamble unit includes a preamble detector for detecting the first and second data according to the first and second preamble information that indicates at least one of respective length and respective pattern of the first and second preambles.

In another embodiment of the present invention, the first and second preamble information are programmed into the programmable unit that is one of a MRS (mode register set) or a programmable fuse circuit.

In this manner, the preambles for parallel data lines are flexibly generated with respective lengths and patterns that are individually adjustable. In addition, such preambles may be set in a programmable unit. Accordingly, performance of the data communication system is enhanced with the properly adjusted preambles that reduce simultaneous switching noise even with variable operating conditions.

BRIEF DESCRIPTION OF THE DRAWINGS

The above and other features and advantages of the present invention will become more apparent when described in detailed exemplary embodiments thereof with reference to the attached drawings in which:

FIG. 10 is a block diagram of a preamble code detector according to some embodiments of the present invention;

FIG. 11 is a timing diagram illustrating transmitting DC balance encoded data according to some embodiments of the present invention;

FIG. 12 is a flowchart of operations that may be performed to transmit DC balance encoded data according to some embodiments of the present invention;

FIG. 19A illustrates a respective length and pattern of preambles for multiple data lines, according to an example embodiment of the present invention;

FIG. 21C is a block diagram of more detailed components in the parallel data transmitting/receiving system of FIG. 21A, according to another example embodiment of the present invention;

FIG. 24 is a flowchart of steps during operation of a receiver that receives data with preambles, according to an example embodiment of the present invention;

The figures referred to herein are drawn for clarity of illustration and are not necessarily drawn to scale. Elements having the same reference number in FIGS. 1 through 29 as described above refer to elements having similar structure and/or function, unless stated other-wise.

DETAILED DESCRIPTION

Figure 1:
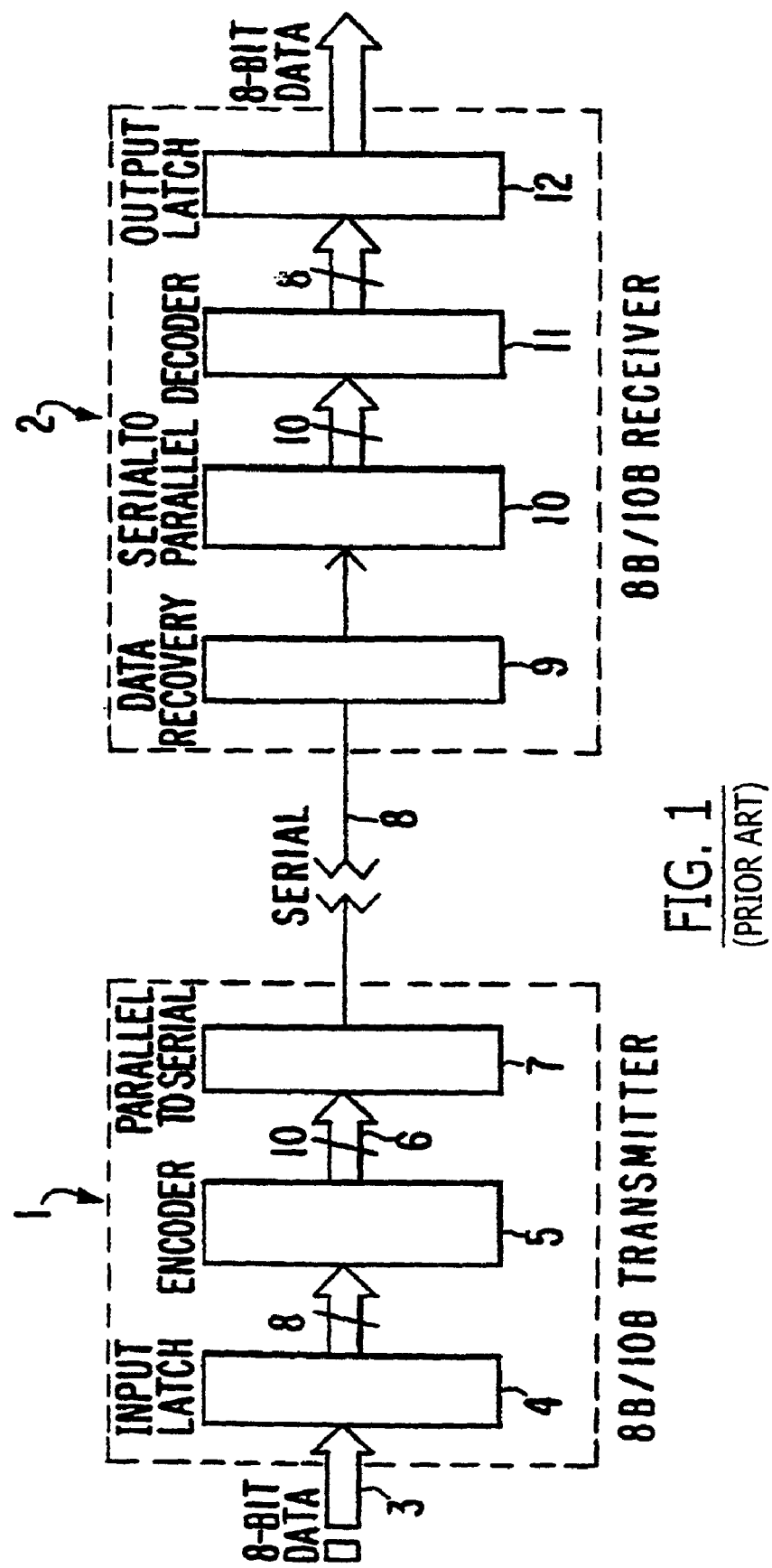
FIG. 1 is a reproduction of FIG. 1 of U.S. Pat. No. 5,387,911.
Figure 2A:
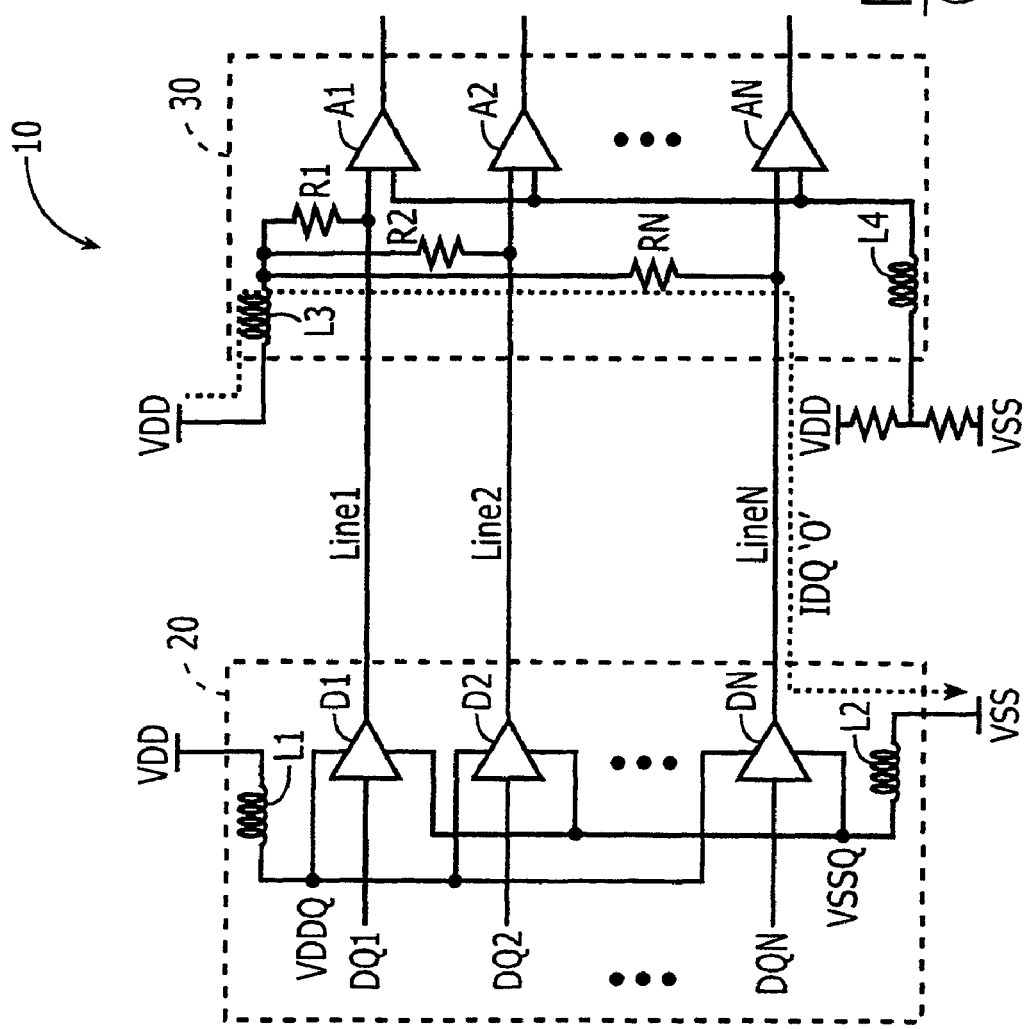
FIGS. 2A and 2B are circuit diagrams of conventional interface systems including a transmitter unit and a receiver unit.
Figure 2B:
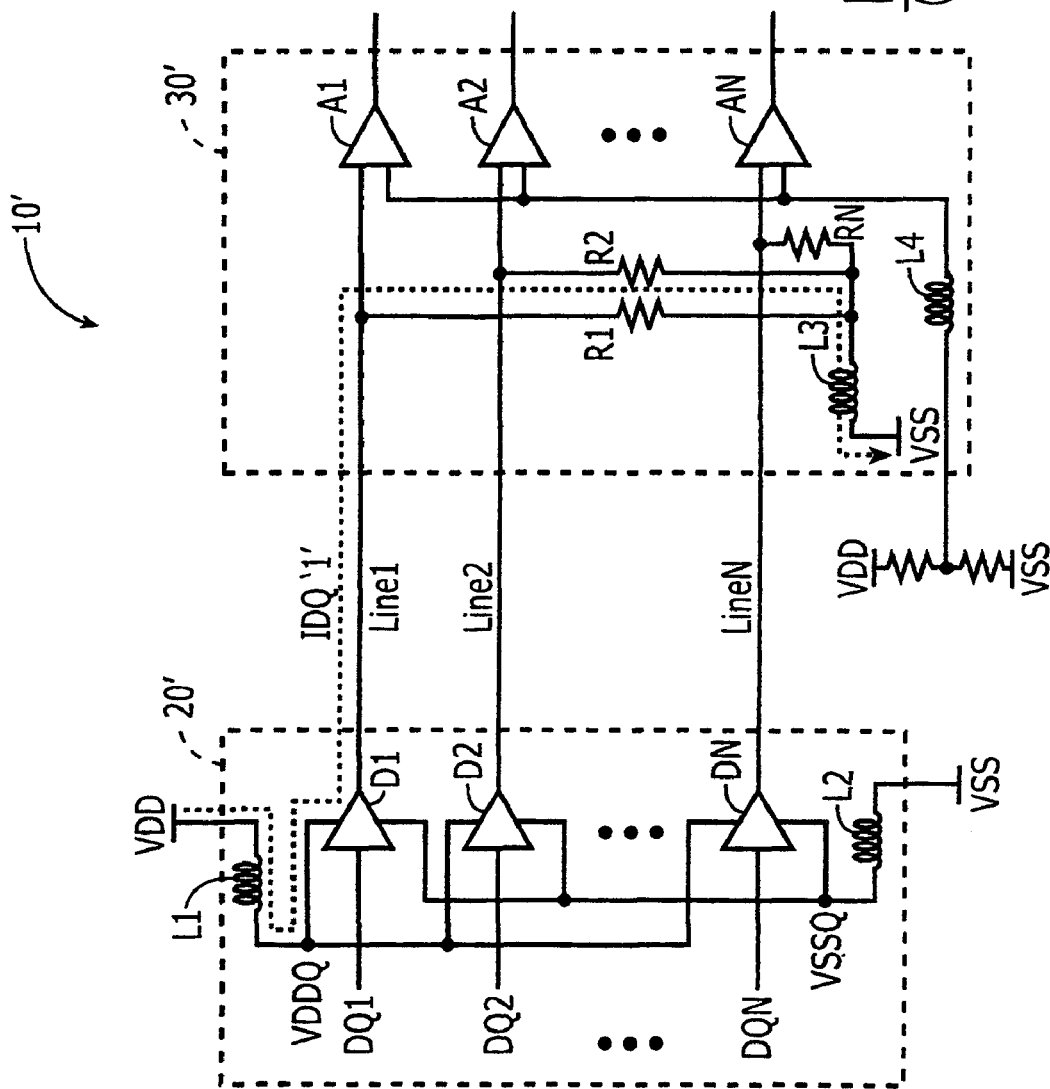
Figure 3A:
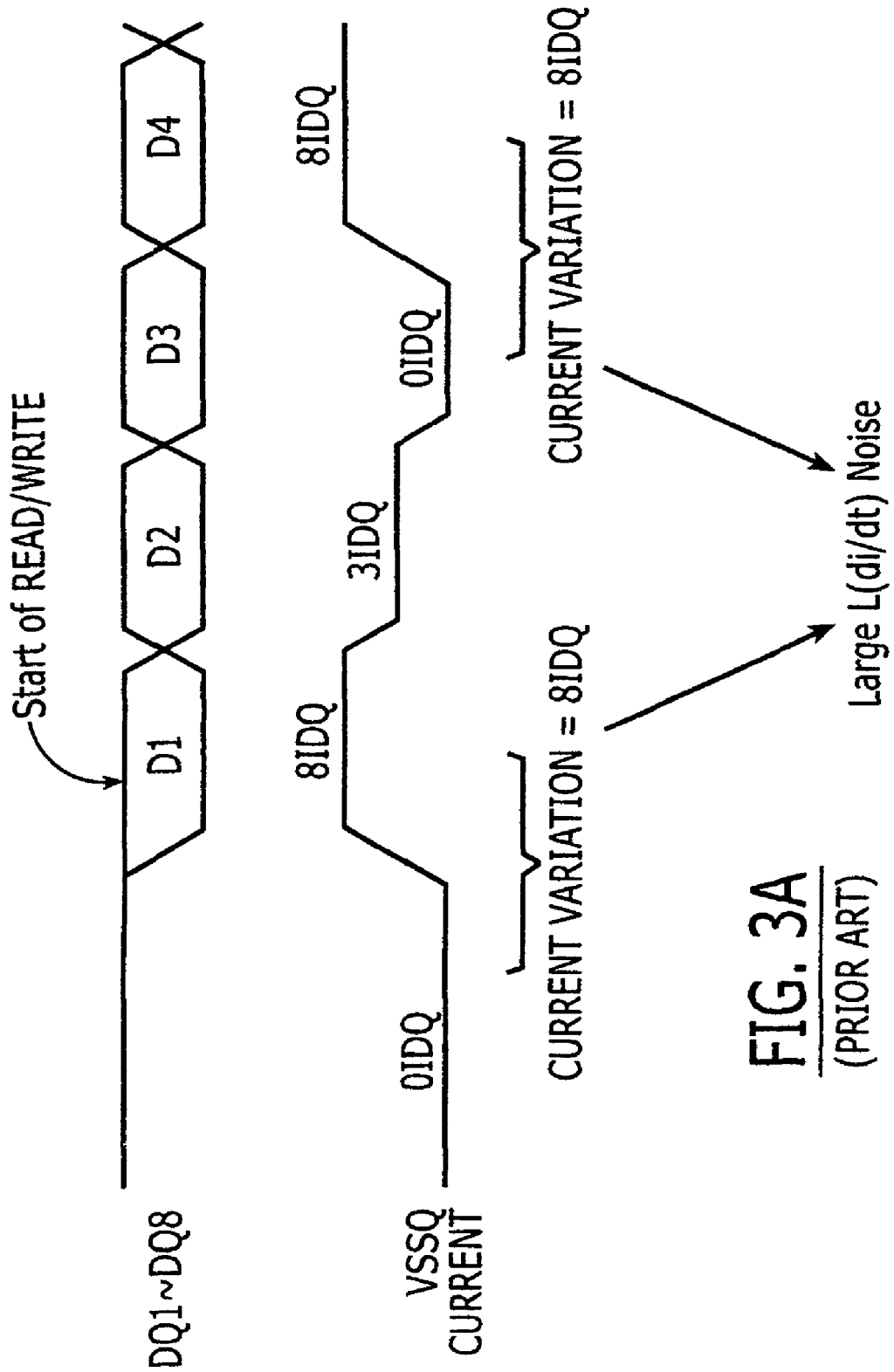
FIG. 3A is a timing diagram of current variation during conventional data transmission.
Figure 3B:
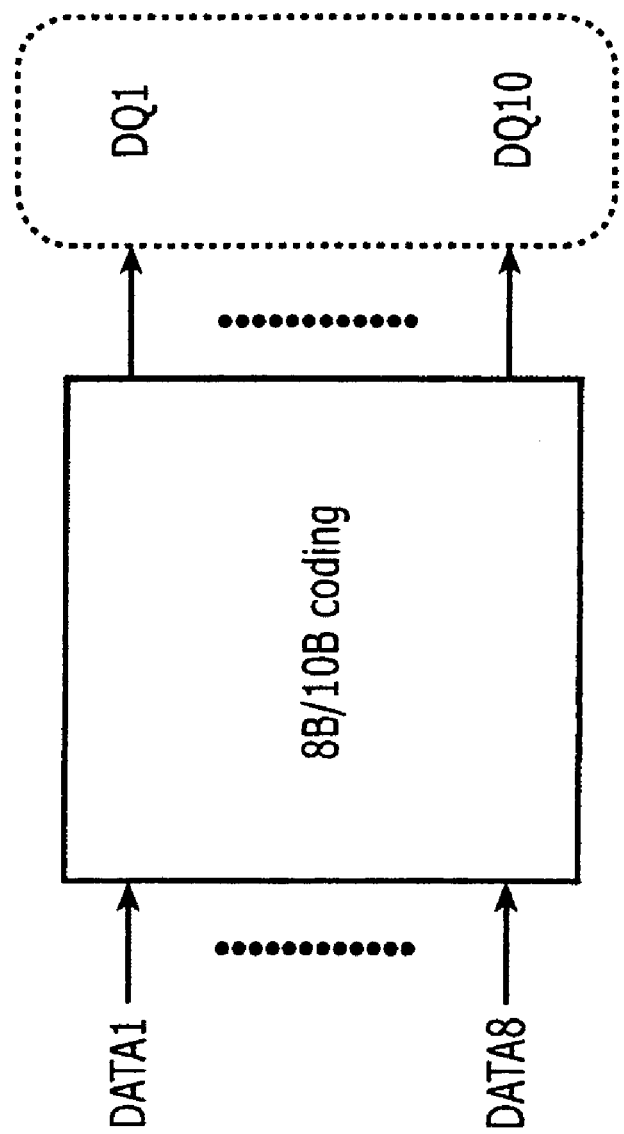
FIG. 3B is a block diagram of conventional DC balance coding using an 8B/10B coding scheme.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element or layer is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/ or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 4:
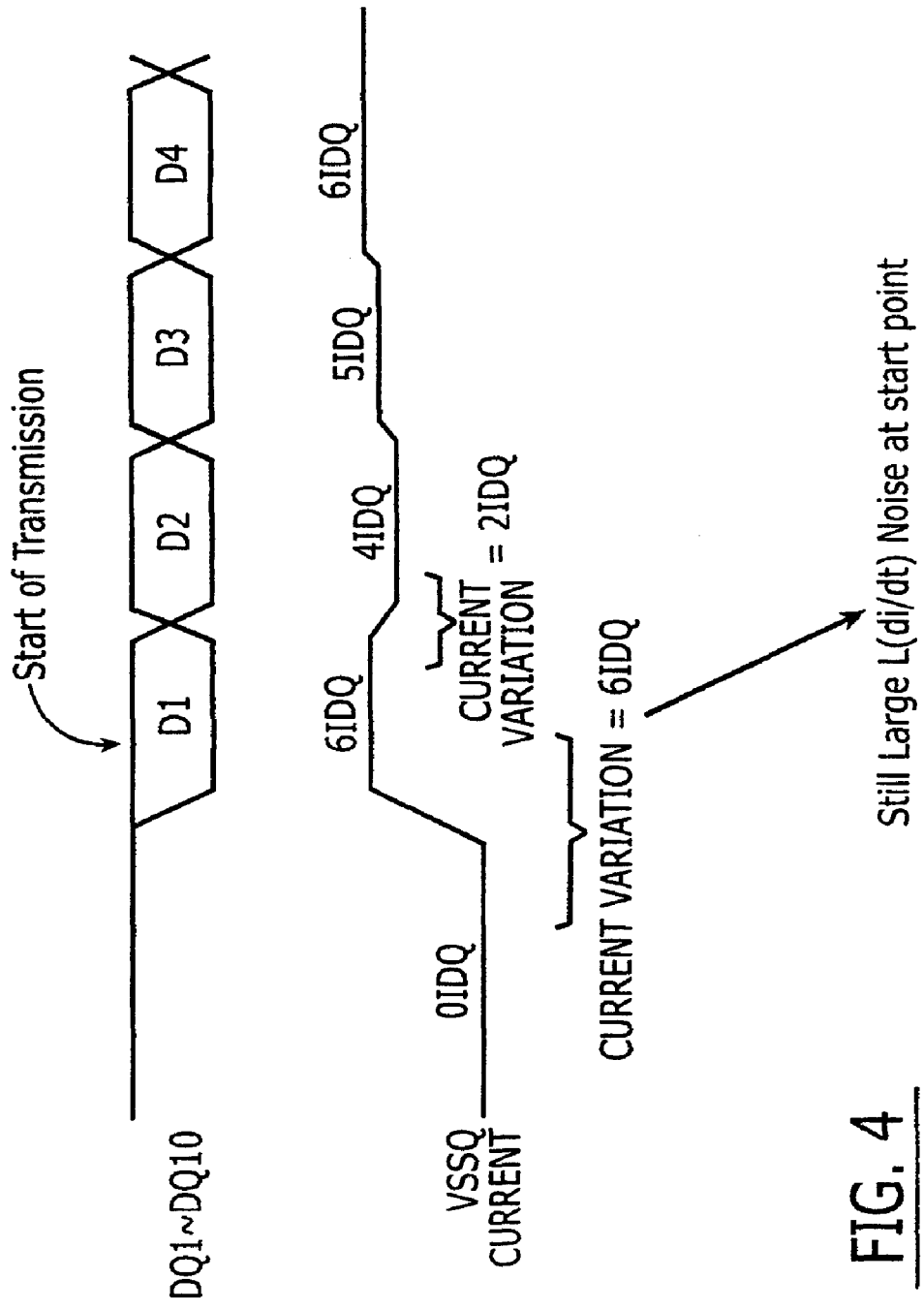
FIG. 4 is a timing diagram of DC balance coding according to some embodiments of the present invention.

Some embodiments of the present invention may arise from a recognition that, although DC balance encoded data, such as 8B/10B DC balance encoded data, can reduce Simultaneous Switching Noise (SSN) among adjacent words of data, large SSN may be created upon transmitting a first word of data. FIG. 4 illustrates this recognition. As shown in the top timing diagram of FIG. 4, a plurality of words of 8B/10B DC balance encoded data are transmitted, as indicated by words D1, D2, D3, D4. Each word includes ten bits DQ1-DQ10. The bottom trace of FIG. 4 indicates the switching current produced by each word, wherein a unit of switching current (VSSQ current) is denoted by IDQ and is proportional to the number of bits of the given logic value, here ZEROs. Thus, as shown by the bottom trace of FIG. 4, the transition between the first word D1 second word D2 produces 2IDQ current variation, the transition between the second word D2 and the third word D3 produces 1IDQ current variation and the transition between the third word D3 and the fourth word D4 produces 1IDQ current variation, in this example. As also shown, the maximum current variation among adjacent words is 2IDQ due to the 8B/10B encoding, and some adjacent words may produce a current variation of only 1IDQ or no current variation due to the 8B/10B encoding.

However, as also shown in FIG. 4, prior to transmitting the first word D1, no switching current is being produced, so that the current variation upon transmitting the first word D1 may be as high as 6IDQ, which is three times the maximum current variation that is provided among adjacent words of the DC balance encoded data. It has been recognized, according to some embodiments of the invention, that this large current variation creates large SSN, also referred to as L(di/dt) Noise, at the start point of data transmission.

Figure 5:
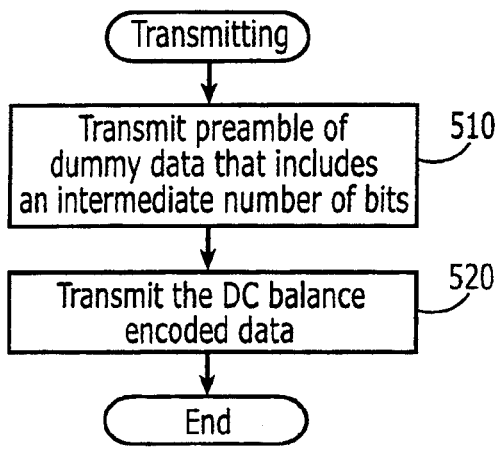
FIGS. 5 and 6 are flowcharts of operations that may be performed to transmit data according to some embodiments of the present invention.

Embodiments of the present invention can reduce this large SSN at the start of data transmission by adding a preamble of dummy data at the start of the transmission. FIG. 5 is a flowchart of operations that may be performed, according to some embodiments of the invention.

Referring now to FIG. 5, the DC balance encoded data is transmitted by first transmitting a preamble of dummy data that is configured to provide an intermediate number of bits of a given logic value. The intermediate number of bits is more than one bit of the given logic value, but less than a maximum number of bits of the given logic value in the DC balance encoded data. Then, at Block 520, the DC balance encoded data itself is transmitted. By preceding the transmission of the DC balance encoded data with a preamble of dummy data that contains an intermediate number of bits, SSN may be reduced compared to absence of the preamble data.

In one example, 8B/10B DC balance encoded data may always include four, five or six ZEROs. In these embodiments, the preamble can have between one and five ZEROs. Other examples will be described below.

As will be described in detail below, in some embodiments, the preamble of dummy data may always include the same intermediate number of bits (a fixed preamble) that is independent of the number of bits of the given logic value in the first word of DC balance encoded data. In other embodiments, the preamble may include a variable number of bits of the given logic value that depends on the number of bits of the given logic value in the first word of DC balance encoded data. Moreover, as will also be described in detail below, a single preamble word (fixed or variable) or multiple preamble words (fixed and/or variable) may be provided. The multiple preamble words may provide an even more gradual current variation and may thereby further reduce SSN compared to the use of a single preamble word. Each of these embodiments and examples thereof will be described in detail below.

Figure 6:
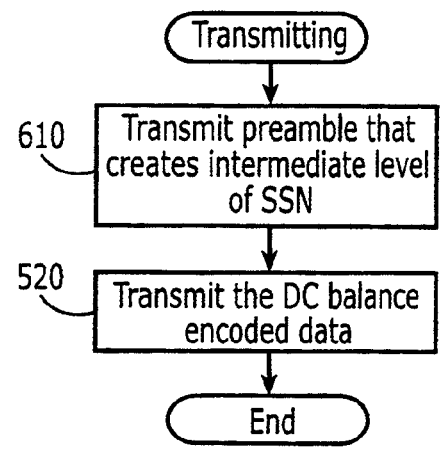

FIG. 6 is a flowchart of operations that may be performed to reduce SSN when transmitting DC balance encoded data according to other embodiments of the present invention. As shown in FIG. 6, at Block 610, a preamble is transmitted that is configured to create an intermediate level of SSN that is more than zero SSN but less than a maximum SSN created by the DC balance encoded data. Then, as was described in Block 520, the DC balance encoded data is transmitted. As was described above, the preamble may be a fixed preamble that is independent of content of a first word of the DC balance encoded data, a variable preamble that is dependent on content of the first word of the DC balance encoded data, a single preamble word and/or multiple preamble words. Accordingly, preambles that are configured in configurations other than an intermediate number of bits of the given logic value may also be provided, as long as they create an intermediate level of SSN.

Figure 7:
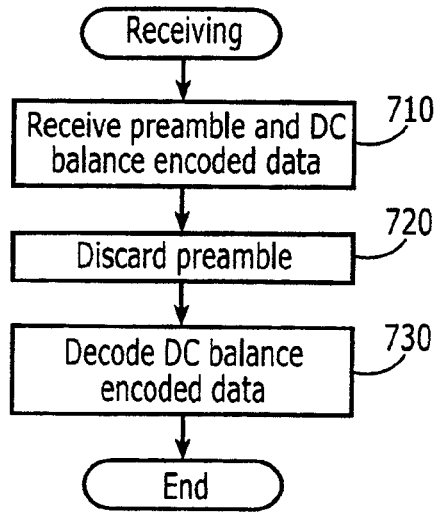
FIG. 7 is a flowchart of operations that may be performed to receive data according to some embodiments of the present invention.

FIG. 7 is a flowchart of operations that may be performed to receive DC balance encoded data according to various embodiments of the present invention. As shown in FIG. 7, a preamble according to any of the above-described embodiments, and the DC balance encoded data, are received at Block 710. The preamble is discarded at Block 720, and the DC balance encoded data is decoded at Block 730.

Various embodiments of the present invention will now be described in connection with FIGS. 8-17. In all of these embodiments, the DC balance encoded data will be 8B/10B DC balance encoded data and the bits of the given logic value will be ZEROs. These embodiments may be used with data receivers that include terminating resistors that may be connected to a power supply voltage. However, it will be understood by those having skill in the art that analogous embodiments for DC balance encoded data other than 8B/10B DC balance encoded data may be provided, and analogous embodiments may be provided if the bits of the given logic value are ONEs, for example, where the terminating resistors may be connected to ground.

Figure 8:
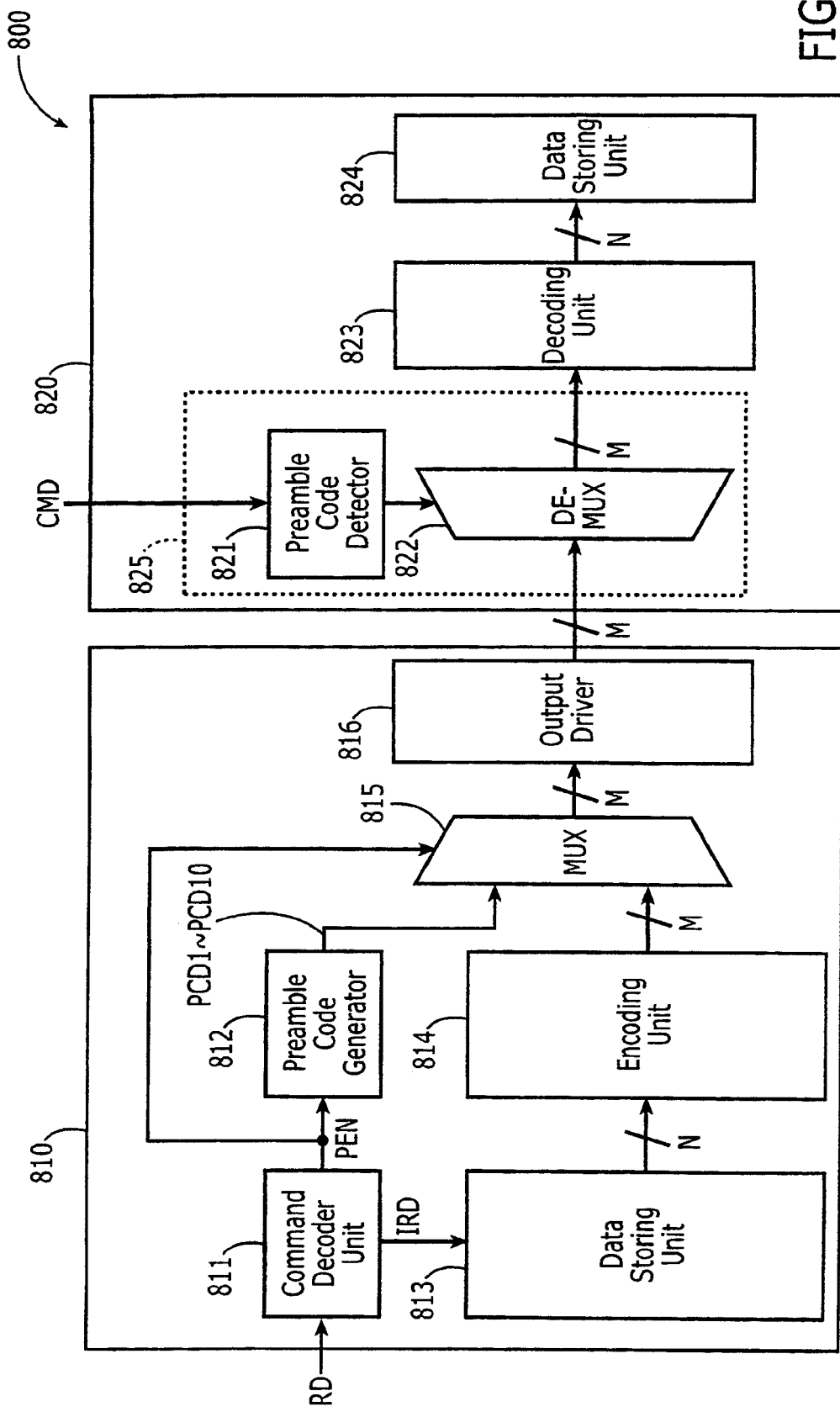
FIG. 8 is a block diagram illustrating data transmission and receiving according to various embodiments of the present invention.

FIG. 8 is a block diagram of a data transmission and receiving system 800 according to various embodiments of the present invention. The transmitting and receiving system 800 is embodied in FIG. 8 as an N-bit single-ended parallel data interface system including a transmitter 810 and a receiver 820. It will be understood, however, that although embodiments of FIG. 8 illustrate transmission from the transmitter 810 to the receiver 820, bidirectional systems also may be provided where each end includes a transmitter and a receiver.

Still referring to FIG. 8, the data transmitter 810 includes a data encoding unit 814 that is configured to encode data, such as N-bit data, into DC balance encoded data, such as M-bit data. A preamble code generator 812 is configured to generate a preamble of dummy data (PCD1-PCD10) that is configured to provide an intermediate number of bits of a given logic value (here ZEROs) that is at least one ZERO, but less than a maximum number of ZEROs in the DC balance encoded data. A multiplexer 815 is responsive to the data encoding unit 814 and to the preamble code generator 812, and is configured to provide one or more M-bit preamble words of dummy data followed by one or more M-bit words of the DC balance encoded data. An output driver 816 is responsive to the multiplexer 815 and is configured to transmit the preamble word(s) of dummy data followed by the word(s) of DC balance encoded data. As also shown in FIG. 8, the transmitter 810 may also include a data storing unit 813 that stores the original data to be DC balance encoded, and a command decoder unit 811 that decodes a command RD and controls the data storing unit 813 (IRD command), the preamble code generator 812 and the multiplexer 815 (PEN command).

Still continuing with the description of FIG. 8, the data receiver 820 includes a data input buffer 825, a decoding unit 823 and a data storing unit 824. The data input buffer 825 is configured to receive data including a preamble of dummy data followed by DC balance encoded data and to detect and discard the dummy data. The decoding unit 823 is configured to decode the DC balance encoded data that was received by the input data buffer 825.

More specifically, as shown in FIG. 8, the data input buffer 825 may include a preamble code detector 821 that is responsive to a command CMD, to detect the dummy data. A demultiplexer 822 is responsive to the preamble code detector 821 (command T) and is configured to selectively discard the dummy data, and to selectively provide DC balance encoded data (M bits) to the decoding unit 823. The decoded data (N bits) is stored in the data storing unit 824. It will also be understood by those having skill in the art that many other configurations of transmitters 810 and receivers 820 may be provided according to various other embodiments of the present invention.

M signal lines are used to transmit the digital signals between the transmitter 810 and the receiver 820. The signal lines may be "on-chip" signal lines that connect various subsystems on a single integrated circuit chip. For example, on-chip signal lines may connect a memory subsystem with a processor or host subsystem on a single integrated circuit chip. The on-chip digital signals may be, for example, data signals from a memory subsystem, often referred to as "DQ" signals. The signal lines may also be "off-chip" signal lines, wherein output drivers drive a digital signal off an integrated circuit chip over a signal line that connects a given chip with another chip, another level of packaging and/or with an external system.

Figure 9:
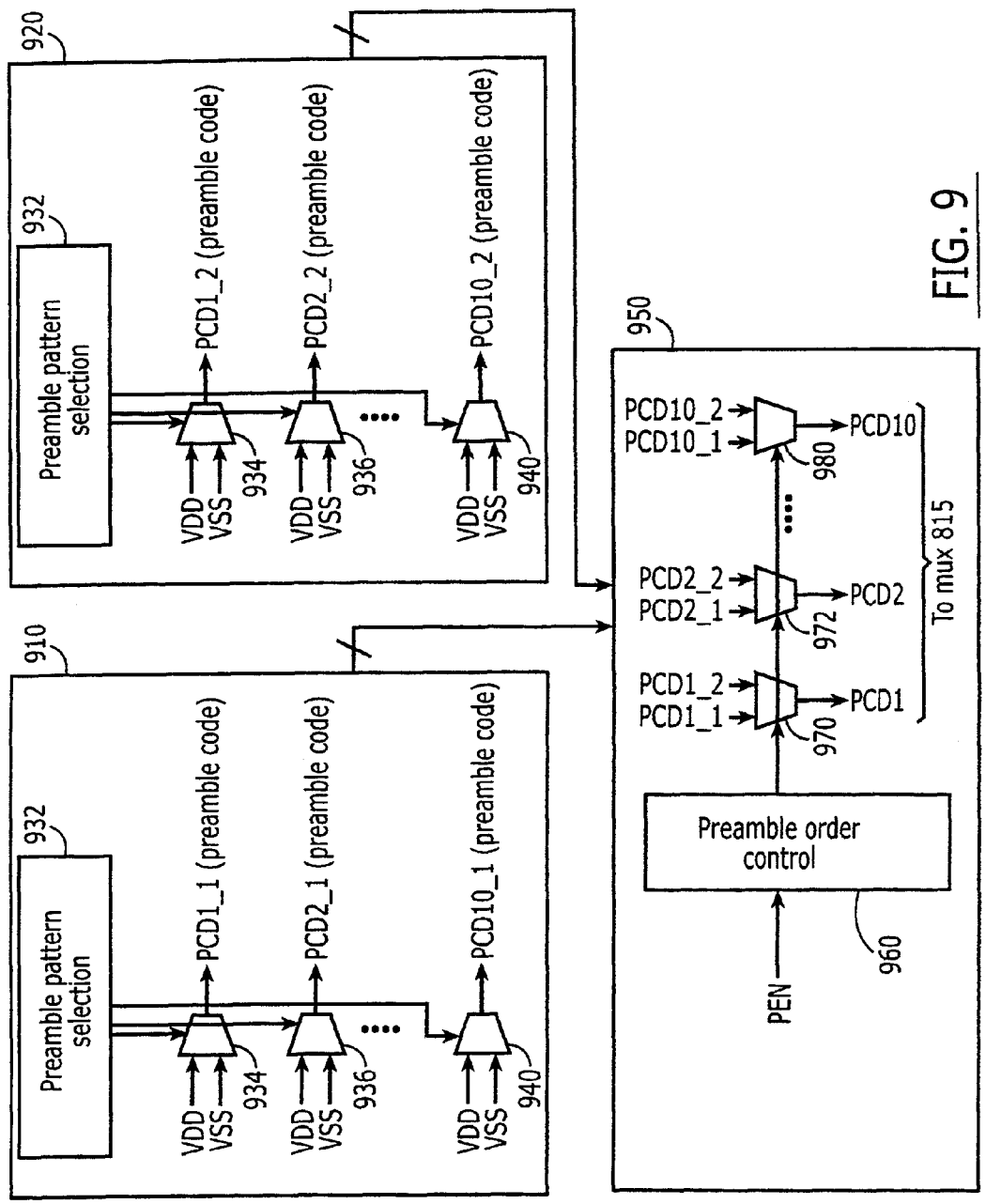
FIG. 9 is a block diagram of a preamble code generator according to some embodiments of the present invention.

FIG. 9 is a block diagram of a preamble code generator, which may correspond to the preamble code generator 812 of FIG. 8. Referring to FIG. 9, in some embodiments of the present invention, two preamble words may be generated so that embodiments of FIG. 9 include two preamble pattern generation units 910, 920. In other embodiments, where a single preamble word is always generated, only a single preamble pattern generation unit may be provided. Each preamble pattern generation unit 910, 920 includes a preamble pattern selection unit 932 and a plurality of selectors 934-940 that select a preamble code word bit PCD1_1-PCD10_1 or PCD1_2-PCD10_2 that is a ONE (VDD) or ZERO (VSS). A preamble word selector 950 then creates the appropriate preamble word or words in response to a command PEN that is applied to a preamble order control unit 960 and is selected by a plurality of selectors 970-980, the outputs of which are provided to the multiplexer 815. It will be understood by those having skill in the art that many other configurations of preamble code generators may be provided according to various other embodiments of the present invention.

FIG. 10 is a block diagram of a preamble code detector, which may correspond to preamble code detector 821 of FIG. 8, according to some embodiments of the present invention. As shown in FIG. 10, a preamble command detection unit 1010 is responsive to a command CMD, which indicates whether a preamble is present. Preamble command detection unit 1010 controls a selector 1020, which provides the command T for the demultiplexer 822 of FIG. 8. In particular, the demultiplexer 822 can discard the preamble or can send the received data to the decoding unit 823. It will also be understood that many other configurations of preamble code detectors may be provided according to various other embodiments of the present invention.

FIG. 11 is a timing diagram of systems and methods for transmitting DC balance encoded data according to some embodiments of the present invention. As shown in FIG. 11, a preamble code word of dummy data (also referred to as DUMMY DQ) is transmitted prior to transmitting the DC balance encoded data words D1-D3. The preamble of dummy data is configured to provide an intermediate number of bits of a given logic value (here ZERO), and contains at least one ZERO but less than the maximum number of ZEROs in the DC balance encoded data. For 8B/10B DC balance encoded data where the maximum number of ZEROs is 6, some embodiments of the present invention can provide a preamble that consists of 2-5 ZEROs. In some embodiments, half the maximum number of ZEROs, or three ZEROs, are contained in the preamble code. As will be described in more detail below, the preamble code may be fixed, i.e., independent of the number of ZEROs in the first word of data D1, so that, for example, it always contains three ZEROs. In other embodiments, the preamble may be a variable preamble that is dependent on the number of ZEROs in the first word D1 of DC balance encoded data. Thus, for example, if the first word D1 consists of only four ZEROs, then the preamble may contain between one ZERO and three ZEROs, and, in some embodiments, may contain half the number of ZEROs in the first word, or two ZEROs.

FIG. 12 is a flowchart of operations that may be performed to transmit DC balance encoded data according to some embodiments of the invention, and provides more detailed operations than the flowcharts of FIGS. 5 and 6. In particular, referring to FIG. 12, operations begin when a transmit command, such as a read or write command, is received at Block 1210. Upon receiving a transmit command at Block 1210, a preamble code is generated with the intermediate number of bits of the given logic level. Moreover, the data is DC balance encoded at Block 1220. The operations of Blocks 1220 and 1230 may occur simultaneously as shown, or in any order including a partially overlapping order. The preamble code is output at Block 1240 followed by the DC balance encoded data at Block 1250.

Figure 13:
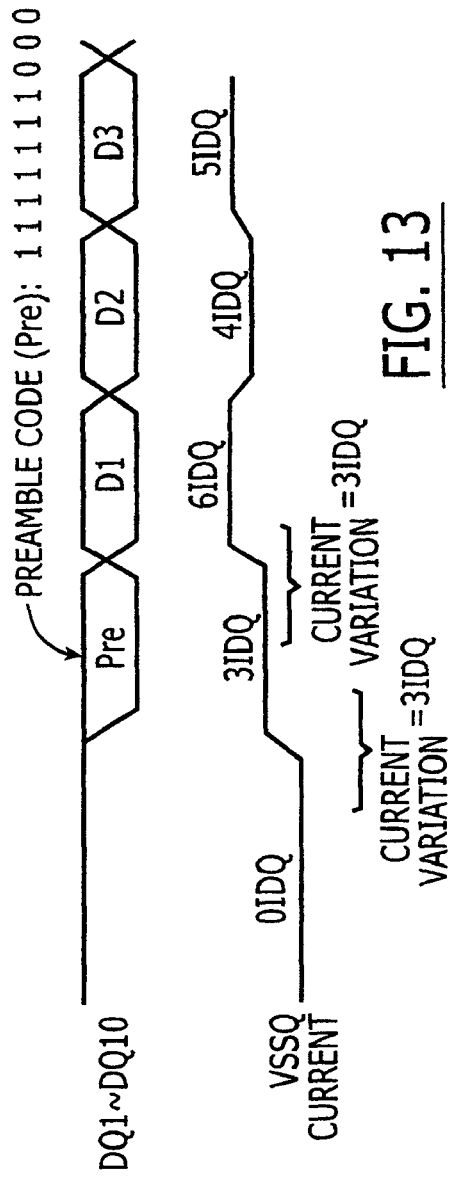
FIG. 13 is a timing diagram that provides a specific example of FIG. 11.

FIG. 13 is a timing diagram illustrating a specific examples of FIG. 11. As shown in FIG. 13, a fixed single word preamble (Pre) code, which contains three ZEROs, is generated and transmitted prior to transmitting the first data word D1. A worst case scenario is shown in FIG. 13, where the first data word D1 includes six ZEROs (the maximum number in the 8B/10B encoding). As was shown in FIG. 4, without the preamble, the current variation upon transmitting the first word D1 would be 6IDQ. However, as shown in FIG. 13, with the preamble, a current variation of 3IDQ is produced upon sending the preamble, and a current variation of 3IDQ is produced between the preamble and the first word D1. Accordingly, SSN may be reduced by half by creating a maximum current variation of 3IDQ rather than 6IDQ.

Figure 14:
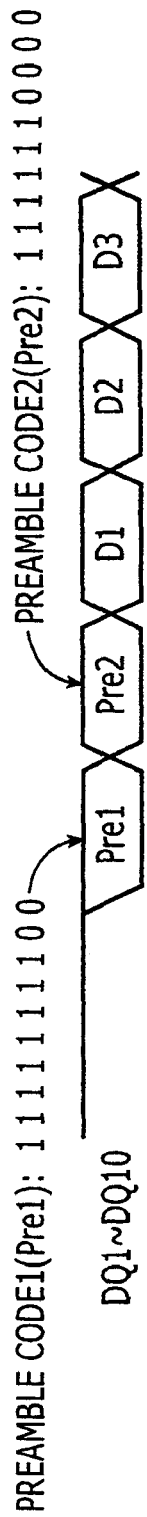
FIG. 14 is a timing diagram of transmitting two fixed preamble words according to some embodiments of the present invention.

FIG. 14 illustrates two fixed preamble words Pre1 and Pre2, where the first fixed preamble word Pre1 has two ZEROs, and the second preamble word Pre2 has four ZEROs. As shown, current variation in this worst case scenario has been reduced to a maximum of 2IDQ, compared to a maximum of 3IDQ in FIG. 13 and a maximum of 6ID1 in FIG. 4.

FIGS. 13 and 14 may also be used to illustrate embodiments of the present invention where variable preambles are used based upon the number of ZEROs in the first word D1. In particular, for a single preamble code (FIG. 13), the single preamble code may contain half the number of ZEROs in the first word. For example, when the first word D1 contains six ZEROs, the variable preamble may contain three ZEROs, as shown in FIG. 13. However, when the first word contains only four ZEROs, the variable preamble word may contain only two ZEROs. In some embodiments, when the first word contains five ZEROs, the variable preamble may contain two or three ZEROs.

Similarly, FIG. 14 may also be used to illustrate variable multiple preamble words according to some embodiments of the present invention. In some embodiments, when first word D1 contains six ZEROs, the preambles may contain two and four ZEROs, as shown in FIG. 14. When the first word contains only four ZEROs, then the first and second preamble words may contain only one and two ZEROs, respectively. When the first data word contains five ZEROs, the preamble may correspond to the preambles for six ZEROs or for four ZEROs, or may be a different preamble. Accordingly, fixed or variable single word and/or multiple word preambles may be provided according to various embodiments of the present invention.

Moreover, one or two preamble words may be used selectively based upon the number of ZEROs in the first data word, in still other embodiments of the invention. For example, if the first data word contains six ZEROs, two preamble words may be used, whereas if the first data word contains only four ZEROs, only a single preamble word may be used. In still other embodiments, if the number of ZEROs in the first data word is four, a preamble may not be used at all.

Figure 15:
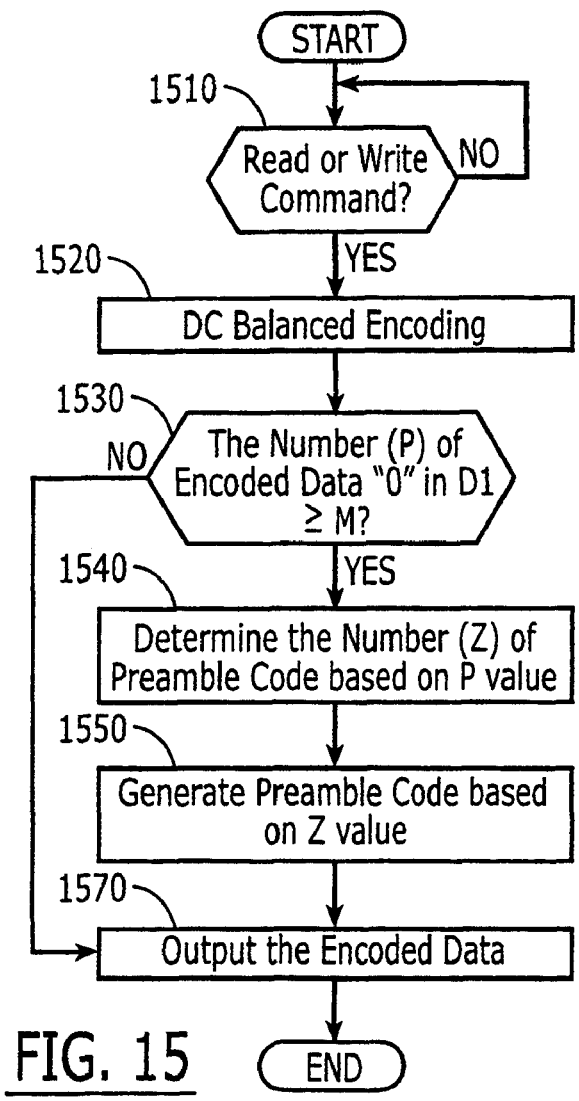
FIG. 15 is a flowchart of operations for transmitting data according to some embodiments of the present invention.

FIG. 15 is a flowchart of operations for transmitting data according to various embodiments of the present invention, wherein the number of preamble words may vary depending on the content of the first data word. In particular, as shown in FIG. 15, operations begin when a transmit command, such as a read or write command is received at Block 1510, and DC balance encoding is performed at Block 1520. A test is then performed at Block 1530, to determine whether the number (P) of encoded data ZEROs in the first data word D1 is greater than or equal to a number M. In some embodiments, M is equal to 5. If the number is not equal to or more than M, then a preamble may not be needed and the DC balance encoded data is output, at Block 1570. On the other hand, if the number is greater than or equal to M at Block 1530, then at Block 1540, the number (Z) of preamble words is determined based on the value of P. Thus, if the difference is small, a single preamble word may be used, whereas if the difference is large, multiple preamble words may be used. At Block 1550, a preamble code is generated based on the value of Z. The preamble code is output at Block 1570.

Figure 16:
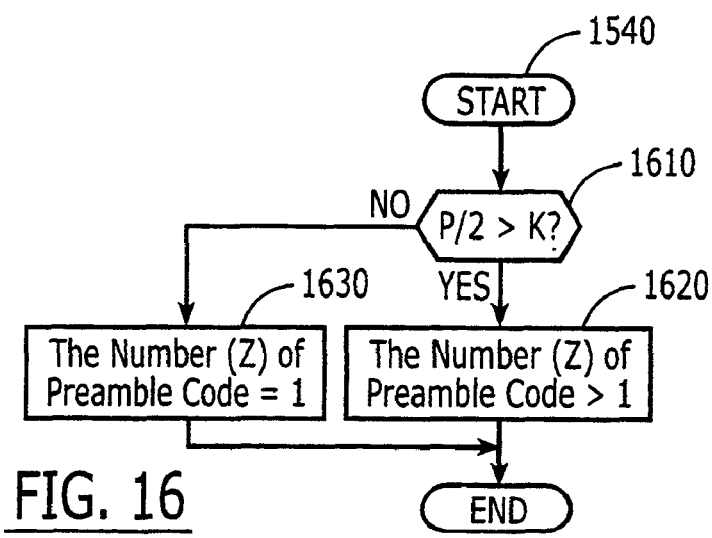
FIG. 16 is a flowchart of operations that may be performed to determine a number of preamble code words to be used according to some embodiments of the present invention.

FIG. 16 is a flowchart of detailed operations that may be performed to determine the number (Z) of preamble code words based on the value of P (the number of ZEROs in the first data word D1), which may correspond to Block 1540 of FIG. 15, according to some embodiments of the invention. In particular, as shown at Block 1610, a test is performed to determine whether the number of P divided by 2 in the encoded data is greater than a constant K. For example, assume K is equal to 2. If yes, then at Block 1620, the number (Z) of preamble code words is greater than one. For example, the number of preamble code words is equal to two. If not at Block 1610, then at Block 1630, the number of preamble code words is equal to one. In a specific example, the number of ZEROs in the first data word can be 4, 5 or 6. Assume K is equal to 2, then for five or six ZEROs, two preamble code words will be assigned at Block 1620, whereas for four ZEROs, only one preamble code word will be assigned at Block 1630.

Figure 17:
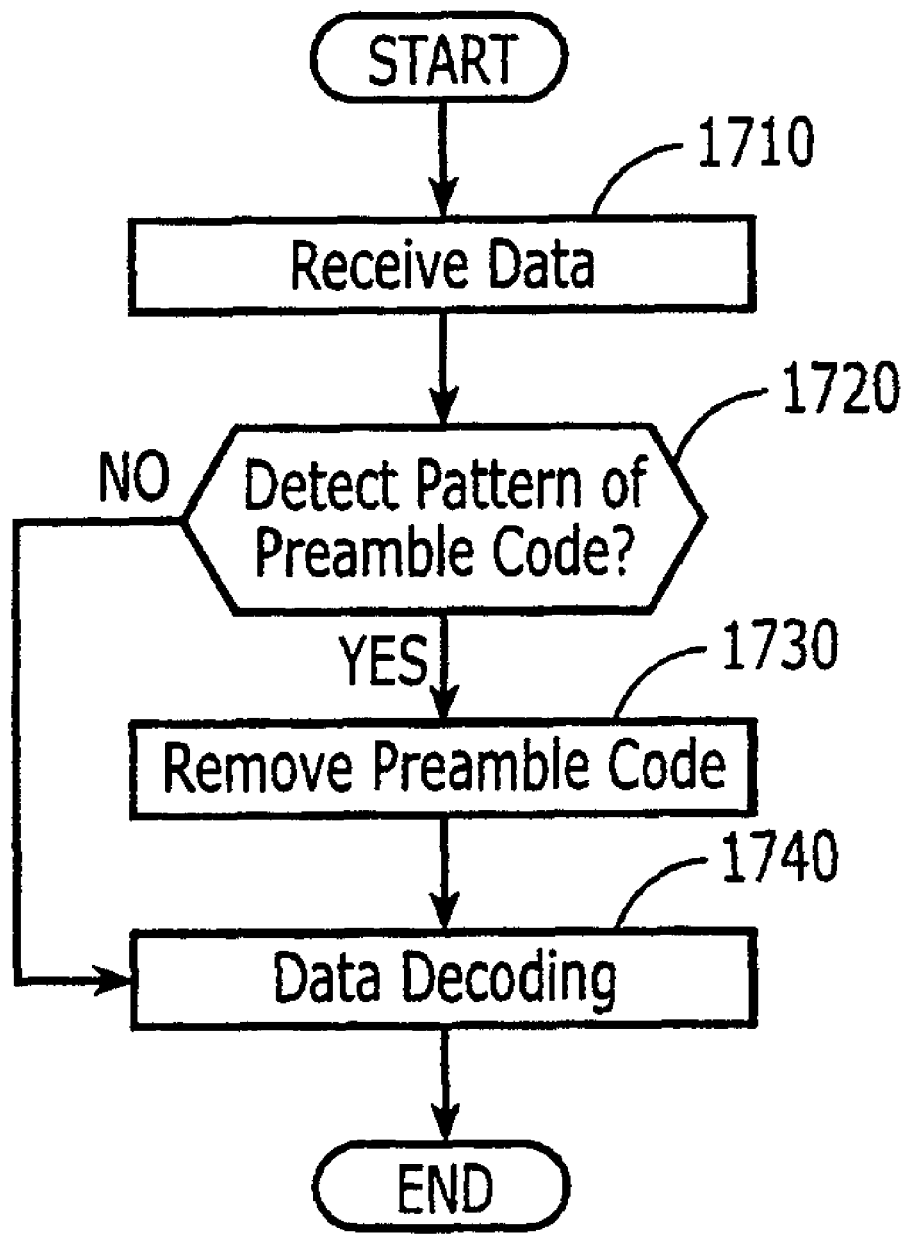
FIG. 17 is a flowchart of operations that may be performed to receive data according to some embodiments of the present invention.

Finally, FIG. 17 is a flowchart of operations that may be performed to receive data according to various embodiments of the present invention, and may provide more detailed operations than the flowchart of FIG. 7. More particularly, referring to FIG. 17, at Block 1710, the data is received including the preamble and the DC balance encoded data. At Block 1720, a pattern of the preamble code is detected. If a preamble code is not present, data decoding proceeds to Block 1740. Alternatively, if the preamble code is present at Block 1720, it is removed or discarded at Block 1730 and then data decoding proceeds at Block 1740.

Accordingly, simultaneous switching noise that is caused at the beginning of transmission of DC balance encoded data may be reduced by adding a preamble of dummy data that creates an intermediate level of SSN that is less than a maximum SSN created by the DC balance encoded data. The preamble may be selectively used depending on the value of the first data word. Moreover, the preamble may be a fixed preamble word and/or a variable preamble word, and/or may include one or more words of fixed and/or variable dummy data.

In the drawings and specification, there have been disclosed embodiments of the invention and, although specific terms are employed, they are used in a generic and descriptive sense only and not for purposes of limitation, the scope of the invention being set forth in the following claims.

Figure 18:
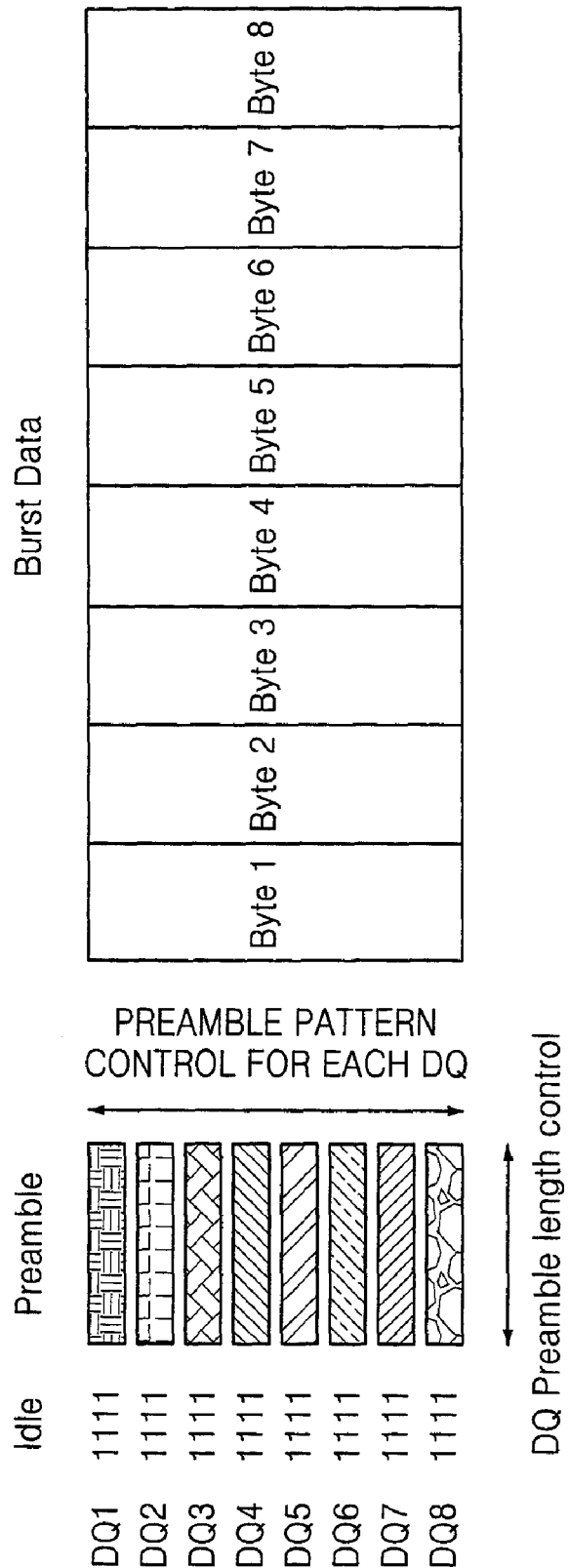
FIG. 18 illustrates a parallel data transmitting/receiving method, according to an example embodiment of the present invention.

FIG. 18 illustrates a parallel data transmitting/receiving method according to an example embodiment of the present invention. FIG. 18 shows a plurality of data words DQ1, DQ2, DQ3, DQ4, DQ5, DQ6, DQ7, and DQ8 that are input and output via respective data lines in parallel. Data of a predetermined logic level, such as the logic high level "1" is initially set at each of the data lines in an idle state.

Further in FIG. 18, a respective preamble of dummy data indicating start of actual data is added before each of the actual data Byte1, Byte2, Byte3, Byte4, Byte5, Byte6, Byte7, and Byte8 for the data lines. According to an aspect of the present invention, such respective preambles for each of the data lines may be adjusted for respective lengths and respective patterns by being programmed or preset. For example, the respective lengths and respective patterns may be varied across the data lines or according to groups of such data lines.

Figure 19B:
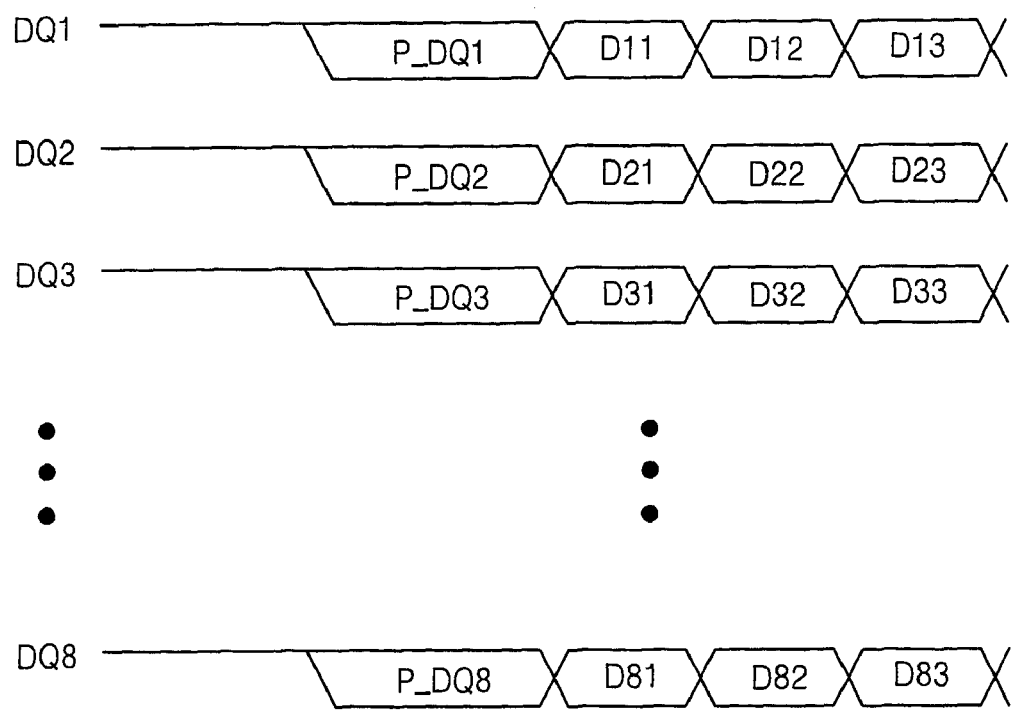
FIG. 19B is a timing diagram of signals on the data lines during transmission of parallel data including the preambles of FIG. 19A, according to an example embodiment of the present invention.

FIG. 19A illustrates an example of respective lengths and patterns of the preambles, according to an example embodiment of the present invention. FIG. 19B is a timing diagram of transmission of parallel data including the preambles of FIG. 19A, according to an example embodiment of the present invention. FIG. 19A also shows a data bus inversion (DBI) line in addition to the eight data lines and has a respective preamble P_DBI.

Referring to FIGS. 19A and 19B, the respective preambles P_DQ1, P_DQ2, P_DQ3, P_DQ4, P_DQ5, P_DQ6, P_DQ7, and P_DQ8 for the eight data lines and P_DBI for the DBI line each have a respective length of eight unit intervals (UIs). Actual data are subsequently transmitted after such respective preambles of 8 bits (or symbols) are transmitted in the example of FIGS. 19A and 19B. However, the respective length of each preamble is independently adjustable in units of 1 UI, according to an example embodiment of the present invention. That is, the respective length of each preamble may be respectively set to one of 1 UI, 2 UIs, 3 UIs, 4 UIs, or 5 UIs, and so forth. The UI is the length of 1 bit (or symbol) for example.

The respective bit pattern of each of the preambles P_DQ1, P_DQ2, P_DQ3, P_DQ4, P_DQ5, P_DQ6, P_DQ7, P_DQ8, and P_DBI is independently adjustable, according to an example embodiment of the present invention. For example, the preambles P_DQ1, P_DQ2, P_DQ3, P_DQ4, P_DQ5, P_DQ6, P_DQ7, P_DQ8, and P_DBI may be set to different respective bit patterns.

In the example of FIG. 19A, the parallel data DQ1, DQ2, DQ3, DQ4, DQ5, DQ6, DQ7, and DQ8 of the eight data lines form one byte (8-bits DQ) of data with the DBI bit indicating whether the 8-bits DQ is inverted. However, the present invention may be practiced with any number of parallel data lines.

Also, the present invention may be practiced with or without the DBI bit. FIGS. 19A and 19B illustrate data with DBI coding. However, the present invention may also be practiced when the parallel data is encoded according to other coding techniques such as 8B/10B coding or 8B/12B coding for direct current (DC) balance.

In the example of FIGS. 19A and 19B, the respective preamble length for the eight data lines DQ1, DQ2, DQ3, DQ4, DQ5, DQ6, DQ7, and DQ8 and the DBI line is 8 UIs forming one group. Alternatively, the present invention may be practiced with the respective preamble length being different for multiple groups of data lines DQ1, DQ2, DQ3, DQ4, DQ5, DQ6, DQ7, and DQ8 and the DBI line.

For example, the data lines DQ1, DQ2, DQ3, DQ4, DQ5, DQ6, DQ7, and DQ8 may be grouped into multiple groups of two or four data lines with each group having independently adjustable respective preamble length and/or pattern. Such grouping of the data lines may be determined by units of semiconductor devices or modules for example as will be described later in more detail.

In the example of FIG. 19A, the first data line DQ1 has a respective preamble P_DQ1 with a respective bit pattern of "10101010", and the second data line DQ2 has a respective preamble P_DQ2 with a respective bit pattern of "01011111". Also, the third data line DQ3 has a respective preamble P_DQ3 with a respective bit pattern of "10100101", and the fourth data line DQ4 has a respective preamble P_DQ4 with a respective bit pattern of "01011100".

Also in FIG. 19A, the fifth data line DQ5 has a respective preamble P_DQ5 with a respective bit pattern of "10100011", and the sixth data line DQ6 has a respective preamble P_DQ6 with a respective bit pattern of "01011110". Also, the seventh data line DQ7 has a respective preamble P_DQ7 with a respective bit pattern of "10101010", and the eighth data line DQ8 has a respective preamble P_DQ8 with a respective bit pattern of "01011011". The DBI line has a respective preamble P_DBI with a respective bit pattern of "01011100".

However, the present invention may be practiced with other respective preambles for each of the data lines DQ1, DQ2, DQ3, DQ4, DQ5, DQ6, DQ7, and DQ8 and the DBI line. The respective length and the respective bit pattern for such preambles of the data lines DQ1, DQ2, DQ3, DQ4, DQ5, DQ6, DQ7, and DQ8 and the DBI line is controllable for each of such lines (as shown by the horizontal arrowed line in FIG. 18). In addition, the respective length and the respective pattern of the respective preambles of the data lines DQ1, DQ2, DQ3, DQ4, DQ5, DQ6, DQ7, and DQ8 and the DBI line is controllable according to groups of such lines (as shown by the vertical arrowed line in FIG. 18).

FIG. 19B illustrates data D11, D21, D31, ..., and D81 being transmitted in parallel on the data lines DQ1, DQ2, DQ3, DQ4, DQ5, DQ6, DQ7, and DQ8 for forming a first data byte after transmission of the preambles P_DQ1, P_DQ2, P_DQ3, P_DQ4, P_DQ5, P_DQ6, P_DQ7, and P_DQ8 on such data lines. FIG. 19B also illustrates D12, D22, D32, ..., and D82 being transmitted in parallel on the data lines DQ1, DQ2, DQ3, DQ4, DQ5, DQ6, DQ7, and DQ8 for forming a second data byte after the first data byte, and so on for each byte (i.e., 8-bits) of data transmitted on such data lines. However, the present invention may be practiced with any number of data lines for transmitting data of any length such as 16 parallel data lines for 16 bits of data or 32 parallel data lines for 32 bits of data.

Figure 20:
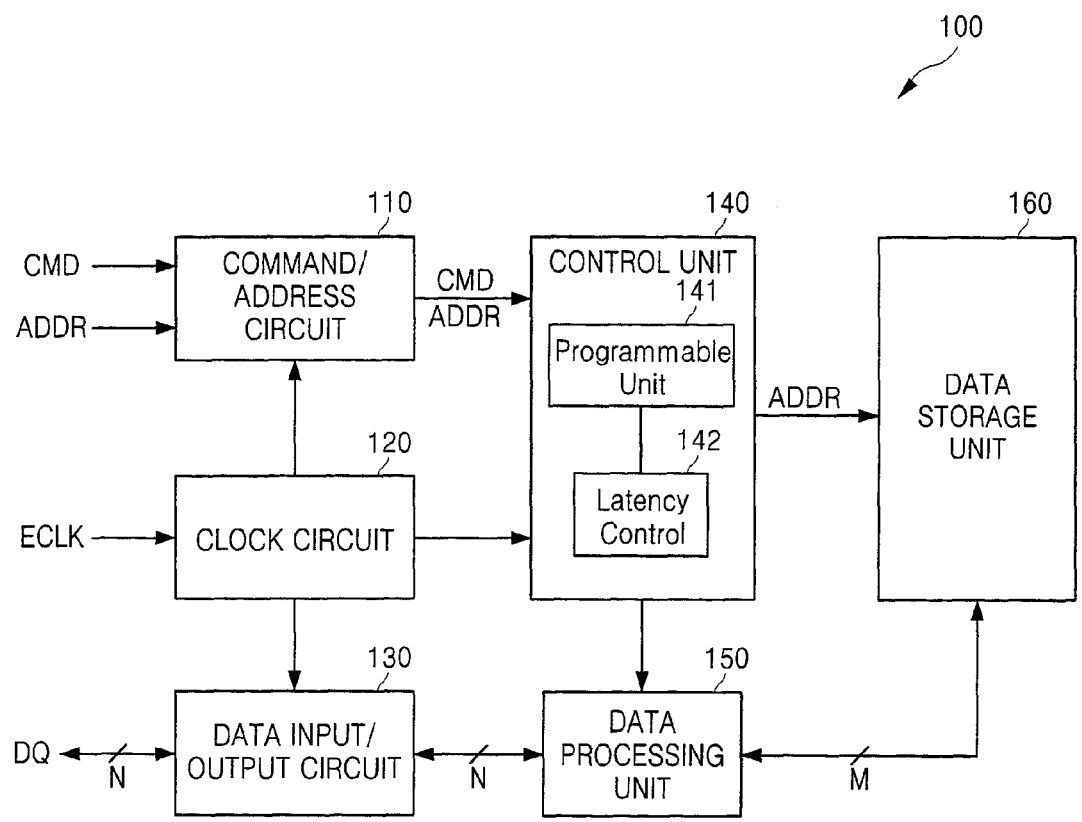
FIG. 20 is a block diagram of a parallel data transmitting/receiving device, according to an example embodiment of the present invention.

FIG. 20 is a block diagram of a parallel data transmitting/receiving device (i.e., a data communication device) 100 such as a semiconductor memory device for example, according to an example embodiment of the present invention. However, the present invention is not limited thereto, and the present invention may be practiced with the device 100 being a memory controller or a graphics processing unit (GPU) or other types of communications devices.

Referring to FIG. 20, the device 100 includes a command/address circuit 110, a clock circuit 120, a data input/output circuit 130, a control unit 140, a data processing unit 150, and a data storage unit 160. The command/address circuit 110 receives a command CMD and an address signal ADDR that are externally generated and transfers such received CMD and ADDR signals to the control unit 140. The CMD and ADDR signals are input in synchronism with an external clock signal ECLK input by the clock circuit 120 in an example embodiment of the present invention.

The clock circuit 120 generates an internal clock signal from the external clock signal ECLK and provides such an internal clock signal to the command/address circuit 110, the data input/output circuit 130, and the control unit 140 that synchronize operations with respect to such an internal clock signal. The control unit 140 receives and decodes the CMD and ADDR signals from the command/address circuit 110 to generate control signals for controlling operation such as data write/read operations of the device 100.

Also, the control unit 140 includes a programmable unit 141 storing a respective length and/or a respective pattern for each of at least one preamble programmed therein. The programmable unit 141 is one of a mode register set (MRS) circuit or a programmable fuse circuit, in an example embodiment of the present invention. When the programmable unit 141 is a MRS circuit, the programmable unit 141 includes mode registers that are set for control of various operations of the device 100.

Figure 22A:
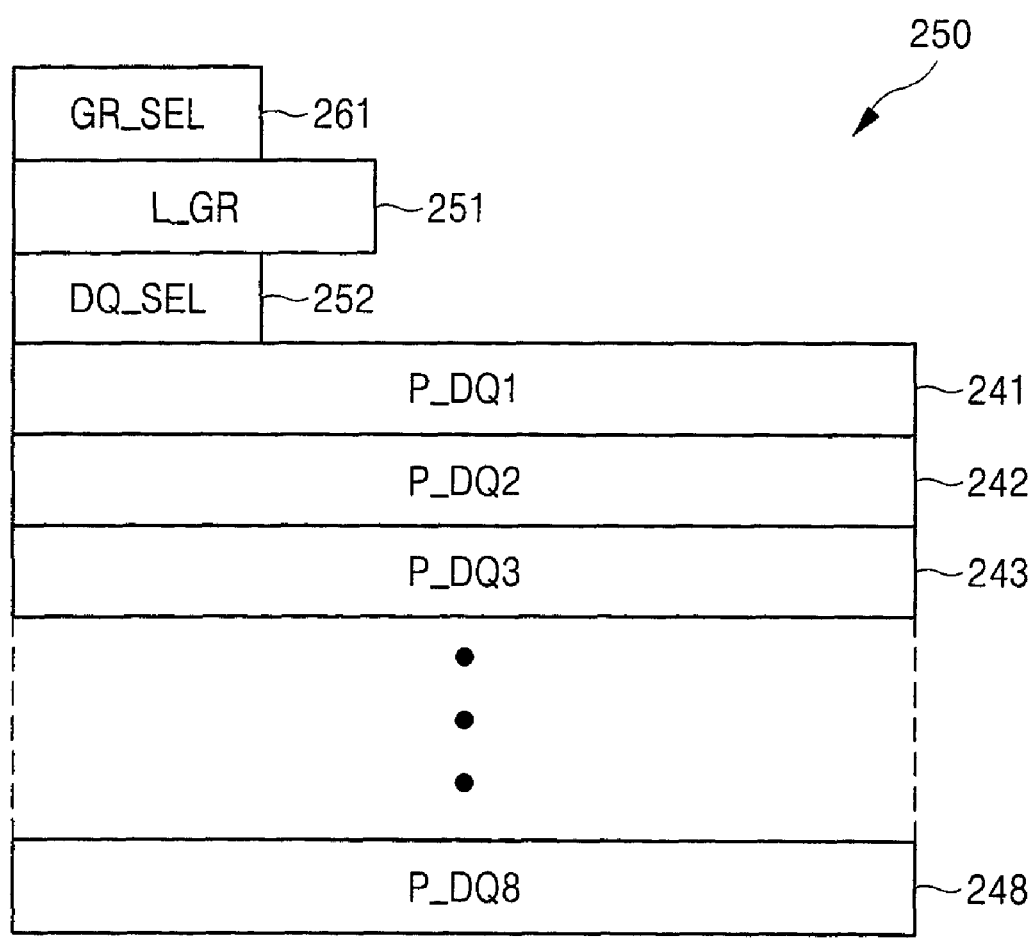
FIGS. 22A and 22B are block diagrams of example MRS circuits each used as a programmable unit for storing preamble information, according to an example embodiment of the present invention.
Figure 22B:
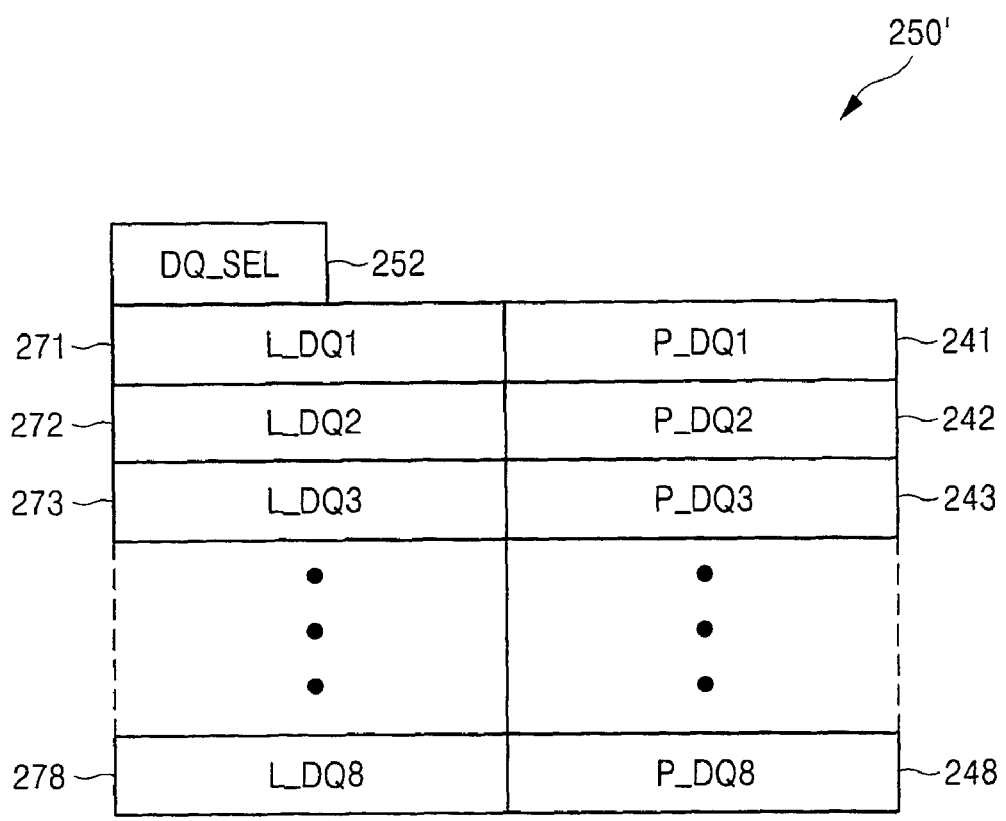

FIGS. 22A and 22B show example mode registers of the programmable unit 141 that is the mode register set (MRS) circuit, according to example embodiments of the present invention. The mode registers of FIGS. 22A and 22B are programmed in response to an MRS command MRS_CMD and the ADDR signals to the device 100 for example.

Also in FIG. 20, the control unit 140 further includes a latency control circuit 142 for controlling latency of data such as a write latency WL and/or a CAS (column address strobe) latency CL. Information for such latencies WL and CL and/or the length of burst data BL is stored in the MRS circuit 141, according to an example embodiment of the present invention.

During data write for example, the latency control circuit 142 delays the ADDR signal according to such write latency information so that column and bank address signals are generated at a desired time point. During the data write, the preamble of such data is detected and removed, and the data is written to a location of the data storage unit 160 as indicated by the column and bank address signals. During data read, the latency control circuit 142 receives CL information from the MRS circuit 141 with the timing of outputting the read data being determined by the CL information and the preamble length.

The data storage unit 160 stores data as input from outside of the device 100 or stores data before being output from the device 100. For example, the data storage unit 160 is a DRAM (dynamic random access memory) in an example embodiment of the present invention. However, the present invention may be practiced with the data storage unit 160 being other types of memory.

The data processing unit 150 provides a data path for data input/output between the data storage unit 160 and the data input/output circuit 130 with control by the control unit 140. The data processing unit 150 may include an encoder (not shown) for encoding data read from the data storage unit 160 and a preamble generation circuit (160 in FIG. 21A) for adding a preamble to the read data or the encoded data. The data processing unit 150 may further include a decoder (not shown) for decoding data input by the data input/output unit 130 and a preamble detector (310 of FIG. 21A) for detecting a preamble from such received data.

The data input/output circuit 130 interfaces with an external device for transmitting data from the data processing unit 150 to the external device during a read operation. Alternatively, the data input/output circuit 130 receives and transfers data from the external device to the data processing unit 150 during a write operation.

Figure 21A:
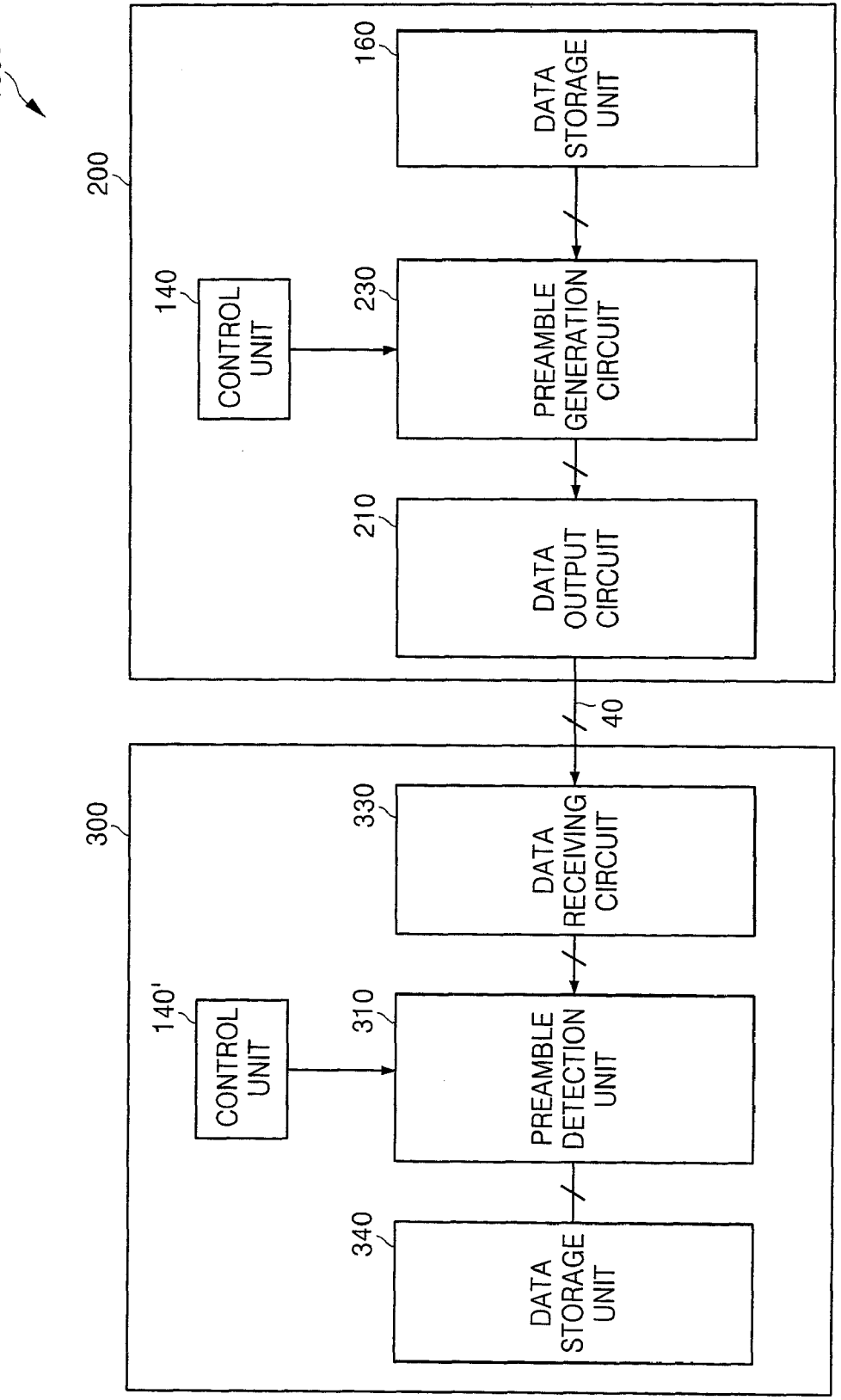
FIG. 21A is a block diagram of a parallel data transmitting/receiving system, according to an example embodiment of the present invention.
Figure 21B:
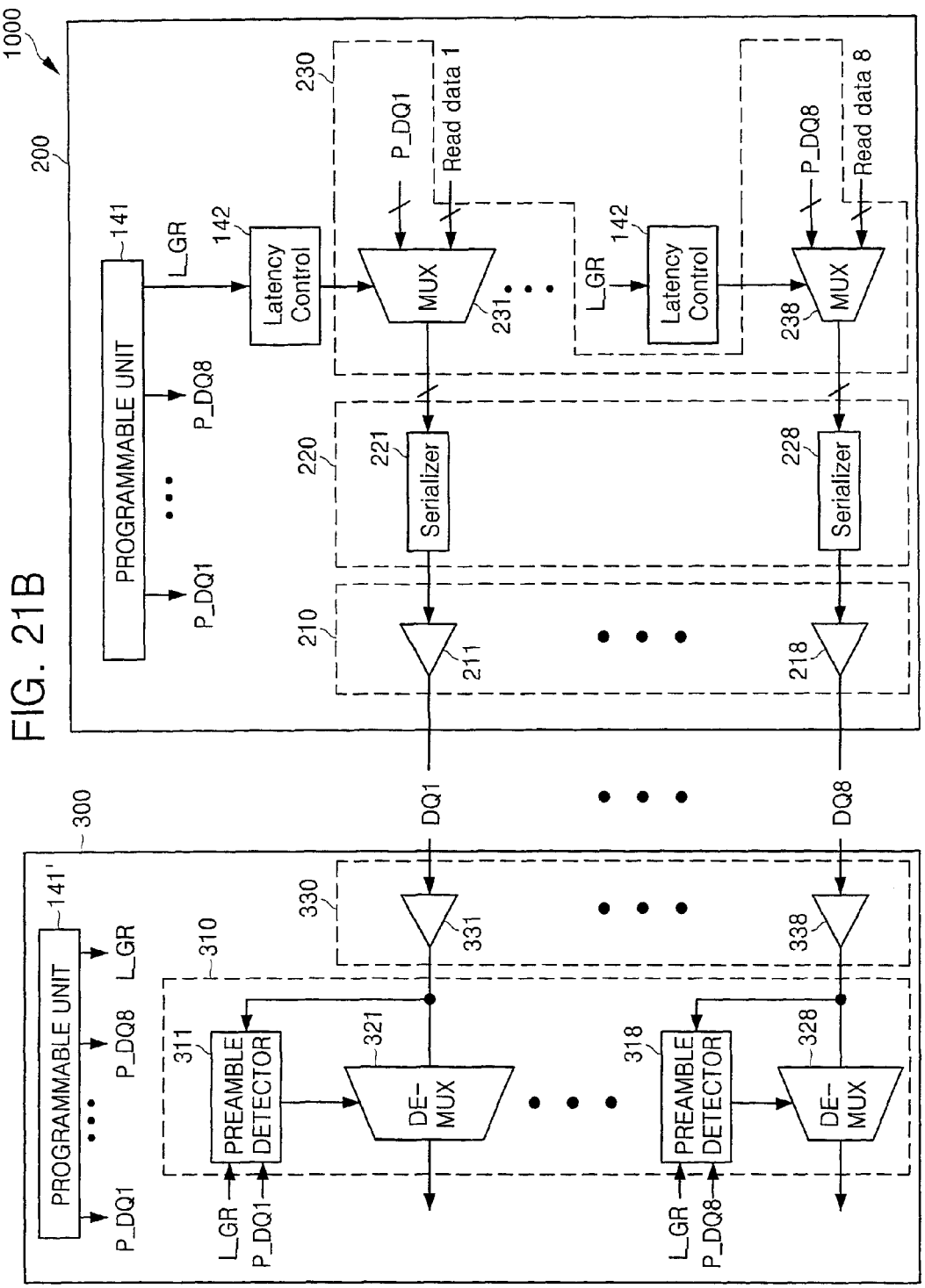
FIG. 21B is a block diagram of more detailed components in the parallel data transmitting/receiving system of FIG. 21A, according to an example embodiment of the present invention.

FIG. 21A is a block diagram of a parallel data transmitting/receiving system (i.e., a data communication system) 1000 according to an example embodiment of the present invention. FIG. 21B is a more detailed block diagram of the data communication system 1000 of FIG. 21A, according to an example embodiment of the present invention.

Referring to FIGS. 21A and 21B, the data communication system 1000 includes a data transmitter 200, a data receiver 300, and a plurality of data lines 40 for parallel data transmitting/receiving between the transmitter 200 and the receiver 300. Each of the transmitter 200 and the receiver 300 includes respective components similar to at least one of the components of the communication device 100 of FIG. 20. In addition, each of the transmitter 200 and the receiver 300 is a respective semiconductor device such as a semiconductor integrated circuit in an example embodiment of the present invention.

The transmitter 200 includes a data output circuit 210 that is an example data interface, the control unit 140 similar to FIG. 20, a preamble generation circuit 230 that is an example preamble unit, and the data storage unit 160 similar to FIG. 20. The transmitter 200 further includes a data alignment unit 220 coupled between the data output circuit 210 and the preamble generation circuit 230. The control unit 140 includes the programmable unit 141 and the latency control circuit 142 similar to FIG. 20, according to an example embodiment of the present invention.

The preamble generation circuit 230 generates a respective preamble with adjustable length and pattern for each of the data lines DQ1, DQ2, DQ3, DQ4, DQ5, DQ6, DQ7, and DQ8. For example, the preamble generation circuit 230 receives such respective preambles as programmed into the programmable unit 141 for addition to the parallel data prior to transmission. Accordingly, the preamble generation circuit 230 includes multiplexers 231, 232, 233, 234, 235, 236, 237, and 238 for addition of the preambles before transmission of the parallel read data 1, 2, 3, 4, 5, 6, 7, and 8 for the data lines DQ1, DQ2, DQ3, DQ4, DQ5, DQ6, DQ7, and DQ8, respectively.

The data output circuit 210 interfaces with the receiver 300 via the parallel data lines DQ1, DQ2, DQ3, DQ4, DQ5, DQ6, DQ7, and DQ8. The data output circuit 210 includes output drivers 211, 212, 213, 214, 215, 216, 217, and 218 for the parallel data lines DQ1, DQ2, DQ3, DQ4, DQ5, DQ6, DQ7, and DQ8, respectively. Such drivers provide signals with proper signal characteristics for transmission on such data lines.

The multiplexers 231, 232, 233, 234, 235, 236, 237, and 238 select between the respective preambles P_DQ1, P_DQ2, P_DQ3, P_DQ4, P_DQ5, P_DQ6, P_DQ7, and P_DQ8 and the respective Read data 1, Read data 2, Read data 3, Read data 4, Read data 5, Read data 6, Read data 7, and Read data 8 according to control by the latency control circuit 142. The Read data 1, Read data 2, Read data 3, Read data 4, Read data 5, Read data 6, Read data 7, and Read data 8 are read from the data storage unit 160 or generated from encoding such as DC balance coding of data from the data storage unit 160. The preambles P_DQ1, P_DQ2, P_DQ3, P_DQ4, P_DQ5, P_DQ6, P_DQ7, and P_DQ8 with respective patterns and respective lengths are programmed and thus stored in the programmable unit 141 and may be output according to a read command.

FIG. 22A illustrates modes registers 261, 251, 252, 241, 242, 243, . . . , and 248 of an example MRS circuit 250 of the programmable unit 141 for storing preamble information. In the example of FIG. 22A, the mode registers 241, 242, 243, . . . , and 248 store preambles P_DQ1, P_DQ2, P_DQ3, . . . , and P_DQ8, respectively, having different bit patterns but a same bit length L_GR. Such a bit length L_GR is stored in the mode register 251.

The MRS circuit 250 of FIG. 22A also includes a group selection mode register 261 and a DQ selection mode register 252. Such mode registers 261 and 252 are used during programming of the P_DQ1, P_DQ2, P_DQ3, . . . , and P_DQ8 (i.e., preamble information) into the mode registers 241, 242, 243, . . . , and 248.

In an alternative embodiment of the present invention, the preamble generation circuit 230 includes a preamble generator (not shown) for generating the respective preambles for the parallel data line DQ instead of previously storing such preambles in the mode registers. For example, such a preamble generator may be a random code generator that generates respective random codes with respective lengths that may be previously set.

The control unit 140 includes the latency control circuit 142 for controlling timing of transmission of the preambles and the parallel data according to a command type such as a read/write command, latency information, and the preamble length L_GR. For example, the latency control circuit 142 controls the multiplexers 231, 232, 233, 234, 235, 236, 237, and 238 such that the preambles are transmitted after a delay of CL corresponding to the read command. In that case, the parallel data read from the data storage unit 160 is transmitted after being delayed by a time period of (CL+L_GR).

Alternatively, the latency control circuit 142 controls the multiplexers 231, 232, 233, 234, 235, 236, 237, and 238 such that the parallel data read from the data storage unit 160 is transmitted after being delayed CL in response to the read command. In that case, the preambles are transmitted with a delay of (CL−L_GR) in response to the read command.

The data alignment unit 220 aligns the parallel signals from the multiplexers 231, 232, 233, 234, 235, 236, and 238 into serial bits to be transmitted via the data lines. Thus, the data alignment unit 220 includes a plurality of serializers 221, 222, 223, 224, 225, 226, 227, and 228 for the data lines DQ1, DQ2, DQ3, DQ4, DQ5, DQ6, DQ7, and DQ8, respectively. Although not illustrated in FIGS. 21A and 21B, the transmitter 200 may further include the command/address circuit 110 and the clock circuit 120 of FIG. 5.

Referring to FIG. 21A, the receiver 300 includes a control unit 140', a preamble detection unit 310 that is another example preamble unit, a data receiving circuit 330, and a data storage unit 340. Referring to FIG. 21B, the preamble detection unit 310 includes a plurality of preamble detectors 311, 312, 313, 314, 315, 316, 317, and 318 and a plurality of demultiplexers 321, 322, 323, 324, 325, 326, 327, and 328 corresponding to the data lines DQ1, DQ2, DQ3, DQ4, DQ5, DQ6, DQ7, and DQ8, respectively. The present invention may also be practiced with the receiver 300 further including a decoding circuit (not shown) and a clock circuit (not shown).

Each of the transmitter 200 and the receiver 300 may be a controller, a DRAM (dynamic random access memory), or an SRAM (static random access memory), in an example embodiment of the present invention. Furthermore, FIGS. 21A and 21B illustrate the transmitter 200 with transmitting elements 140, 160, 210, and 230, and illustrate the receiver 300 with the receiving elements 140', 310, 330, and 340. However, the transmitter 200 may also include respective components (not shown) for receiving data, and the receiver 300 may also include respective components (not shown) for transmitting data.

Referring to FIG. 21B, the control unit 140' of the receiver 300 includes a programmable unit 141' and a latency control circuit, similar to the control unit 140 of the transmitter 200. The data input circuit 330 is an example data interface that receives the preambles and the parallel data via the parallel data lines 40. The data input circuit 330 includes a plurality of data buffers 331, 332, 333, 334, 335, 336, 337, and 338 for processing signals from the parallel data lines DQ1, DQ2, DQ3, DQ4, DQ5, DQ6, DQ7, and DQ8, respectively.

The preamble code detectors 311, 312, 313, 314, 315, 316, 317, and 318 generate demux control signals from detection of the respective preambles from the signals of the data buffers 331, 332, 333, 334, 335, 336, 337, and 338, respectively. Preamble information such as respective bit patterns and/or respective lengths of the expected preambles are previously programmed and stored in the programmable unit 141' (similarly as described in reference to FIG. 22A), in an example embodiment of the present invention. In that case, the preamble code detectors 311, 312, 313, 314, 315, 316, 317, and 318 detect the preambles by finding the expected bit patterns and lengths as previously stored in the programmable unit 141'.

The demultiplexers 321, 322, 323, 324, 325, 326, 327, and 328 remove the respective preambles from the parallel data in response to the demux control signals to generate the parallel data without the respective preambles. Such parallel data from the demultiplexers 321, 322, 323, 324, 325, 326, 327, and 328 may be decoded by a decoding circuit and then stored in the data storage unit 340.

The present invention may also be practiced with the receiver 300 not including the preamble code detection unit 310. For example, the parallel data is received with a delay of a write latency from a write command. In that case, the preambles are separated from the parallel data by ignoring such preambles before the write latency from the write command. The parallel data is received after the delay of the write latency from the write command.

Alternatively, the preambles are received after a delay of the write latency from the write command. In that case, the parallel data is received after a delay of (write latency+preamble length) from the write command. Accordingly, the preambles are separated from the parallel data by ignoring such preambles before the time period of (write latency+preamble length) from the write command. Thereafter, the parallel data is received with the preambles separated away. In either case, the latency control circuit in the control unit 140' controls such timing of receiving the parallel data with the preambles separated away.

FIG. 21C is a block diagram of a parallel data transmitting/receiving system (i.e., data communication system) 1000' according to another example embodiment of the present invention. The structure and operation of the systems of FIGS. 21B and 21C are substantially similar. Thus, the differences between FIGS. 21B and 21C are now described.

In the data communication system 1000 of FIG. 21B, the 8 data lines DQ1, DQ2, DQ3, . . . , and DQ8 are set as one group having the corresponding one preamble length L_GR. Thus, the preambles P_DQ1, P_DQ2, P_DQ3, . . . , and P_DQ8 each have a same preamble length L_GR for that one group even though such preambles have respective bit patterns that may be individually set.

In contrast in the data communication system 1000' of FIG. 21C, the eight data lines DQ1, DQ2, DQ3, . . . , and DQ8 are set to different multiple groups having different respective preamble lengths. In the example of FIG. 21C, the preambles P_DQ1, P_DQ2, P_DQ3, . . . , and P_DQ8 have respective preambles lengths L_DQ1, L_DQ2, L_DQ3, . . . , and L_DQ8 and respective bit patterns. FIG. 22B shows the MRS circuit 250' for storing such bit patterns and preamble lengths.

Referring to FIG. 22B, the MRS circuit 250' includes a DC selection register 252 used for programming the MRS circuit 250'. The MRS circuit 250' also includes a plurality of mode registers 271, 272, 273, 274, 275, 276, 277, and 278 for storing the respective preamble lengths L_DQ1, L_DQ2, L_DQ3, . . . , and L_DQ8 for the eight data lines DQ1, DQ2, DQ3, . . . , and DQ8, respectively. In addition, the MRS circuit 250' also includes a plurality of mode registers 241, 242, 243, 244, 245, 246, 247, and 248 for storing the respective preamble bit patterns P_DQ1, P_DQ2, P_DQ3, . . . , and P_DQ8 for the eight data lines DQ1, DQ2, DQ3, . . . , and DQ8, respectively.

FIGS. 21B and 21C show respective programmable units 141 and 141' for the transmitter 200 or 200' and the receiver 300 or 300'. However, the present invention may also be practiced with one programmable unit being shared by the transmitter 200 or 200' and the receiver 300 or 300' for storage of preamble information including the preamble length(s) and the preamble patterns for the data lines DQ1, DQ2, DQ3, . . . , and DQ8.

Figure 23:
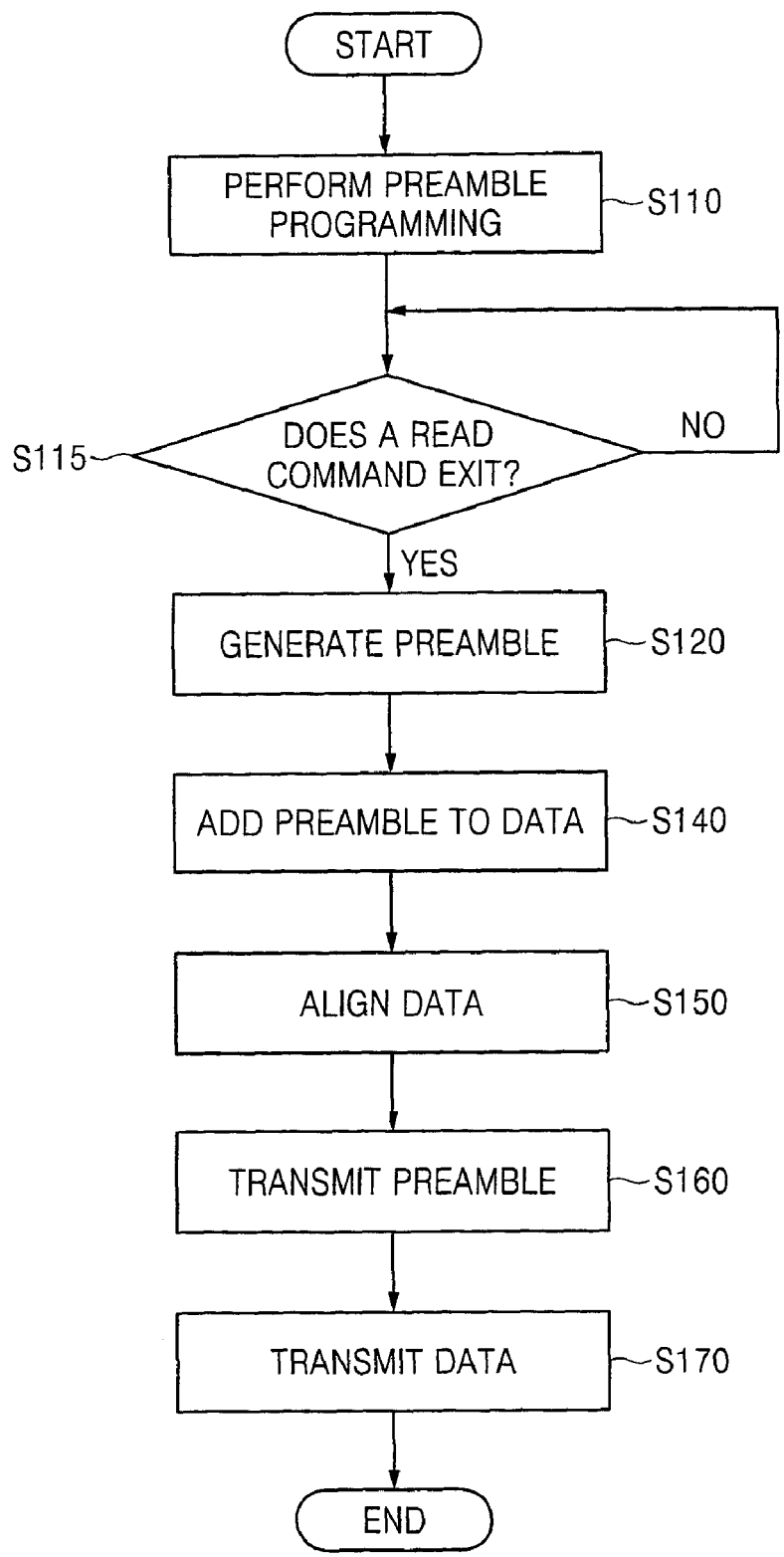
FIG. 23 is a flowchart of steps during operation of a transmitter that transmits data with preambles, according to an example embodiment of the present invention.

FIG. 23 shows a flowchart of steps during operation of the transmitter 200 or 200', according to an embodiment of the present invention. The preamble information such as the bit patterns and at least one length of the preambles for the data lines DQ1, DQ2, DQ3, . . . , and DQ8 is programmed into the programmable unit 141 or 141' (step S110 of FIG. 23).

Figure 25A:
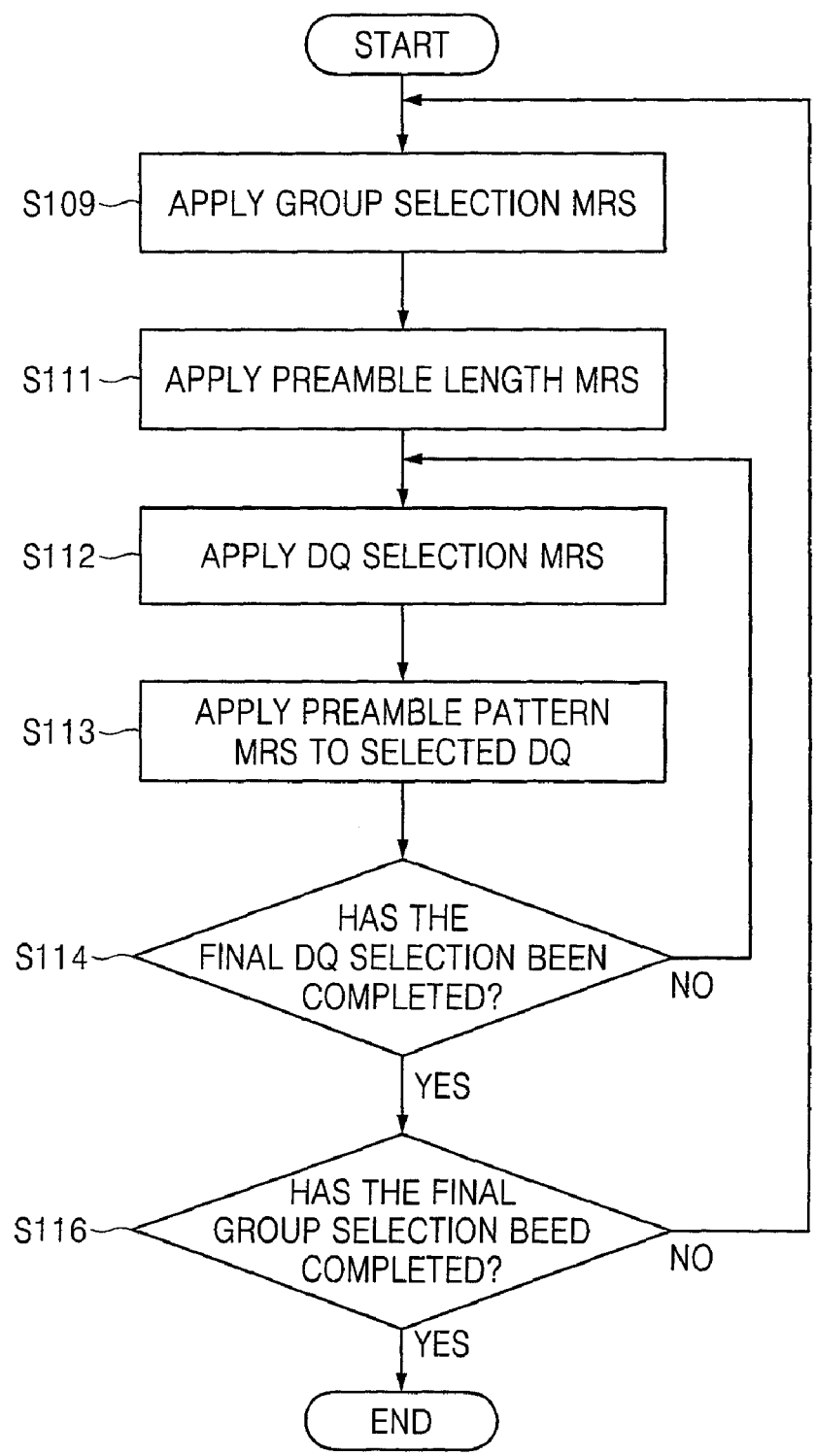
FIGS. 25A and 25B show flowcharts of steps for programming a programmable unit with preamble information, according to example embodiments of the present invention.

FIG. 25A shows a flowchart of steps for programming the programmable unit 250 of FIG. 22A with such preamble information, according to an example embodiment of the present invention. For example, the data communication device 100 enters a MRS setting mode whereby the programmable unit 250 (or 141 in FIG. 20) is programmed by an external device (not shown) or a user, referred to hereinafter as a programmer, via the command/address circuit 110. FIG. 25A shows a flowchart of steps performed by such a programmer to store preamble information into the programmable unit 250 of FIG. 22A.

Referring to FIGS. 22A and 25A, a group selection MRS (GR_SEL) is applied to indicate selection of a group of data lines (step S109 of FIG. 25A). The group that is selected is indicated by a respective identification as stored in the group selection mode register 261. In addition, a respective preamble length L_GR is programmed into the respective mode register 251 for the selected group (step S111 of FIG. 25A).

Furthermore, a data line selection MRS (DQ_SEL) is applied to indicate a selection of a data line (step S112 of FIG. 25A). The data line that is selected is indicated by a respective identification as stored in the DQ selection mode register 252. A respective bit pattern P_DQn for the selected DQ line is programmed into the respective one of mode registers 241, 242, 243, . . . , and 248 for the selected DQ line (step S113 of FIG. 25A).

Subsequently, the programmer checks whether the final data line has been selected for programming the bit pattern of the respective preamble (step S114 of FIG. 25A). Steps S112, S113, and S114 are repeated until a respective bit pattern has been programmed into all of the mode registers 241, 242, 243, . . . , and 248 for the eight data lines.

Thereafter, the programmer checks whether the final group of data lines has been selected for programming the respective preamble length (step S116 of FIG. 25A). Steps S109, S111, S112, S113, S114, and S116 are repeated until a respective preamble length has been programmed for all of the at least one group of data lines.

Figure 25B:
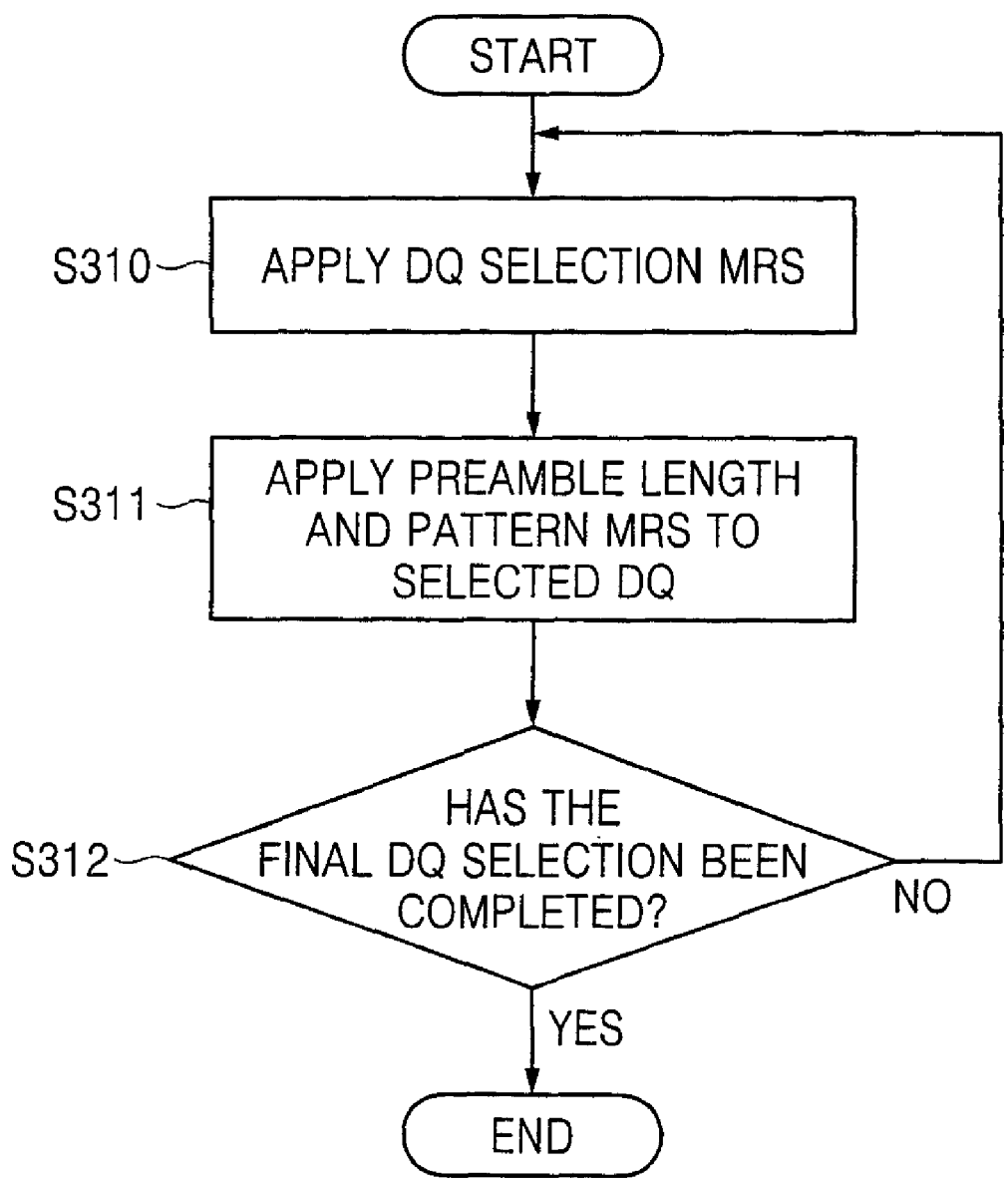

FIG. 25B shows a flowchart of steps for programming the programmable unit 250' of FIG. 22B with preamble information, according to an example embodiment of the present invention. For example, the data communication device 100 enters a MRS setting mode whereby the programmable unit 250' (or 141 in FIG. 20) is programmed by an external device (not shown) or a user, referred to hereinafter as a programmer, via the command/address circuit 110. FIG. 25B shows a flowchart of steps performed by such a programmer to store preamble information into the programmable unit 250' of FIG. 22B.

Referring to FIGS. 22B and 25B, a data line selection MRS (DQ_SEL) is applied to indicate a selection of a data line (step S310 of FIG. 25B). The data line that is selected is indicated by a respective identification as stored in the DQ selection mode register 252.

In addition, the respective length L_DQn for the selected data line is programmed into a respective one of the mode registers 271, 272, 273, . . . , and 278 (step S311 of FIG. 25B). Furthermore, the respective bit pattern P_DQn for the selected data line is programmed into a respective one of the mode registers 241, 242, 243, . . . , and 248 (step S311 of FIG. 25B).

Subsequently, the programmer checks whether the final data line has been selected for programming the length and bit pattern of the respective preamble (step S312 of FIG. 25B). Steps S310, S311, and S312 are repeated until the length and bit pattern of the respective preamble has been programmed into all of the mode registers 241, 242, 243, . . . , and 248 for the eight data lines.

The above-described preamble programming operation of FIG. 25A or 25B may be performed at any time during power-up or other operations of the parallel data communication device 100. Alternatively, the preamble information may be programmed using switches in a programmable fuse circuit that is formed as the programmable unit 141 during an integrated circuit fabrication process.

Referring back to FIG. 23, after the preamble information has been programmed (step S110 of FIG. 23), the control unit 140 determines whether a read command is received (step S115 of FIG. 23). If a read command is received, data to be transmitted is read from the data storage unit 160 in response to the read command. Such read data may be encoded before being transmitted. The encoding method may be for DC balance coding such as 8B/10B coding, 8B/12B coding, or the DBI coding.

In addition, the preamble generation circuit 230 generates the preambles for the data lines or reads such preambles from the mode registers of the programmable unit 141 in response to the read command (step S120 of FIG. 23). After such preambles are added to the data read from the data storage unit 160 (step S140 of FIG. 23), the data alignment unit 220 aligns the data for serial data transmission (step S150 of FIG. 23). The preambles for the data lines DQ are transmitted to the receiver 300 (step S160 of FIG. 23) before the parallel data from the data storage unit 160 is transmitted to the receiver 300 (step S170 of FIG. 23).

FIG. 24 shows a flowchart of steps during operation of the receiver 300 according to an example of the present invention. The data receiving circuit 30 of the receiver 300 receives the preambles and the parallel data from the transmitter 200 (step S210 of FIG. 24). The preamble detection unit 310 detects for the presence of preambles (step S220 of FIG. 24). If the preambles are detected, the preamble detection unit 310 removes the preambles from the parallel data to detect the parallel data with the preamble separated away (step S230 of FIG. 24). Such parallel data may then be stored into the data storage unit 340 of the receiver 300.

The preamble indicates the start time point of the parallel data read from the data storage unit 160 and transmitted by the transmitter 200. Another words, detection of the preamble distinguishes between an idle state and transmission of burst data between the transmitter 200 and the receiver 300. For example, when the receiver 300 detects a preamble during the idle state, the receiver 300 recognizes a time point for receiving burst data that is then received with reduced error.

In addition, detection of the preamble may also be used for synchronization of internal data using a preamble detection signal. For example, such a preamble detection signal may be used for reset of a first in first out (FIFO) register during transmission of the internal data.

In this manner, the preamble for the parallel data lines DQ are flexibly set and/or adjusted. For example, if the bit pattern for the preamble is simple, such a preamble may be difficult to distinguish from the parallel data. In that case, more complicated bit patterns and lengths that are more easily detected are set for the data lines.

In addition, effective bit patterns and lengths of the preambles may be determined through simulations and tests and set according to operating characteristics of the data communication system such as the operation frequency, transmission speed, or board of the data communication system. Such flexibility of adjusting the bit patterns and lengths of the preambles effectively minimize noise such as simultaneous switching noise (SSN) and/or inter-symbol interference (ISI).

Figure 26A:
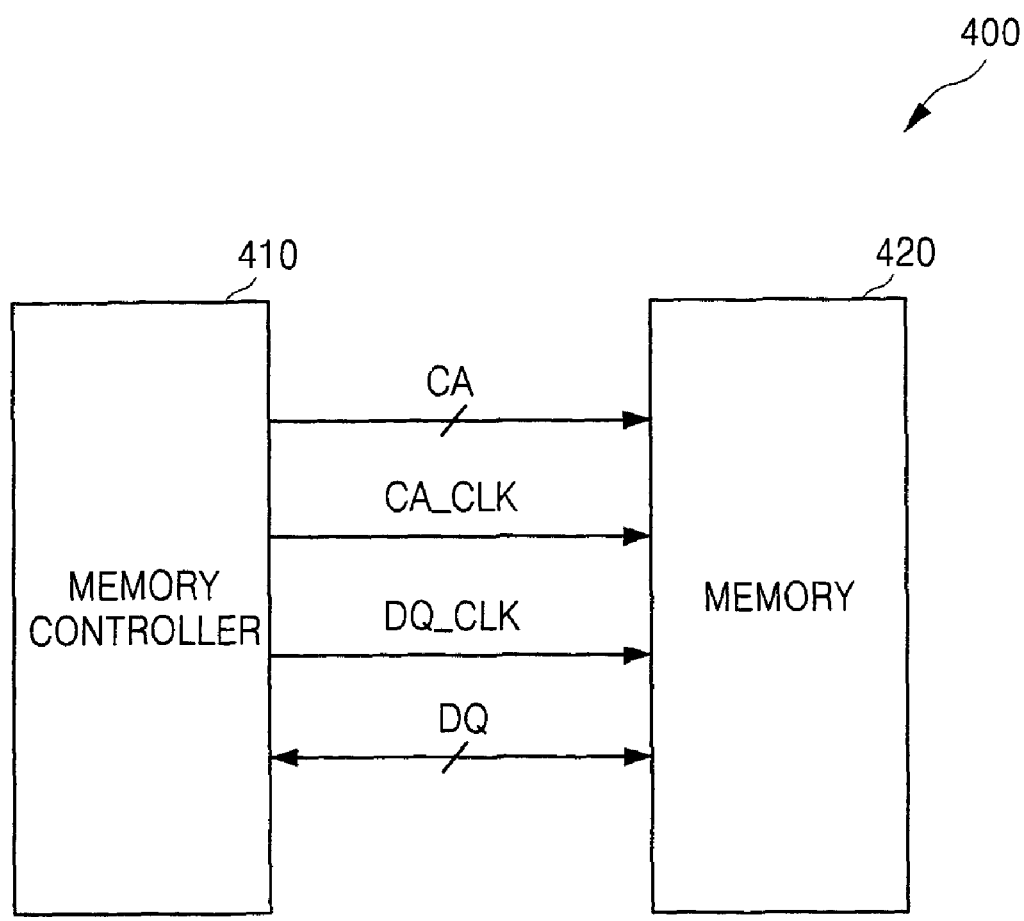
FIGS. 26A and 26B are block diagrams of parallel data transmitting/receiving systems, according to example embodiments of the present invention.
Figure 26B:
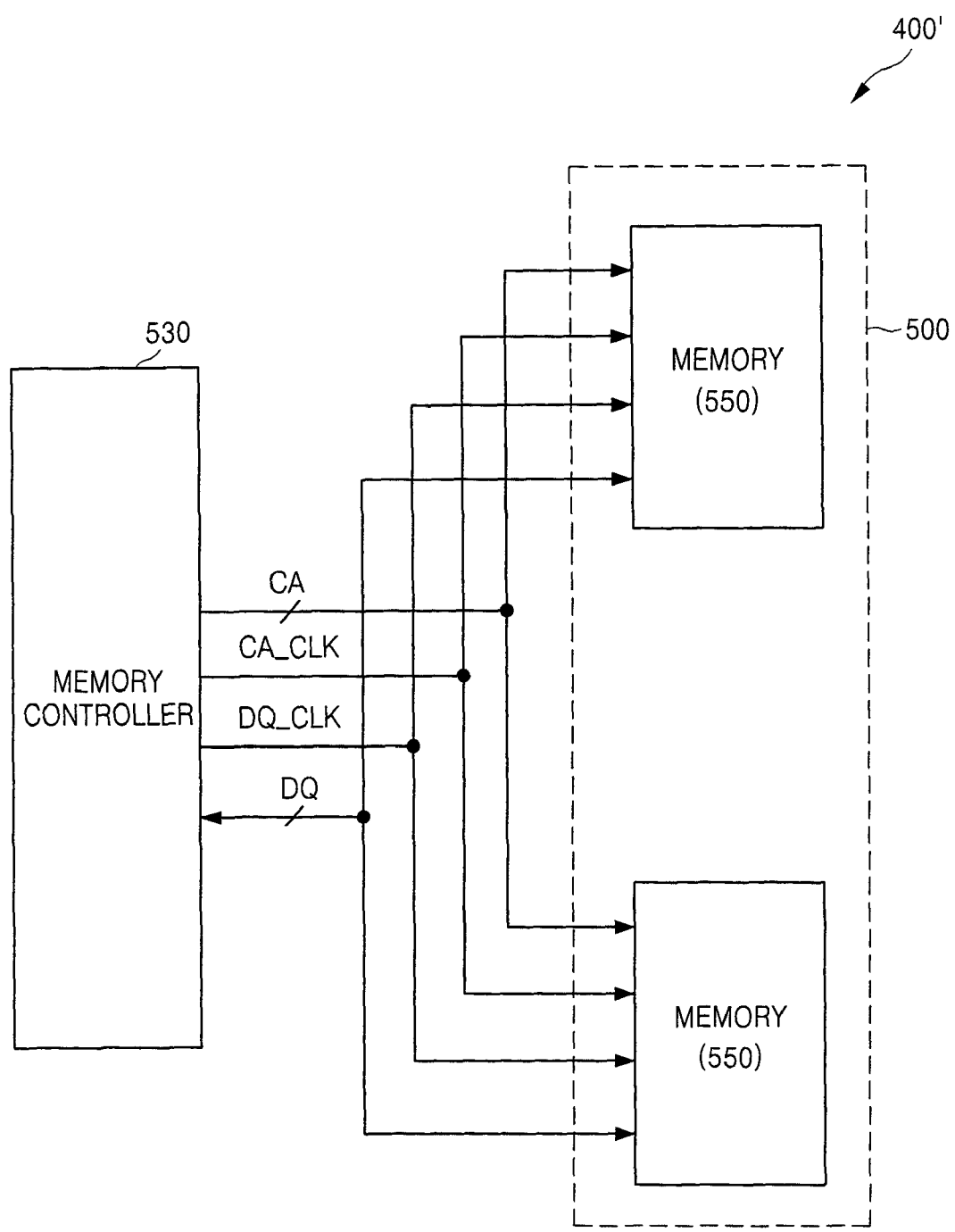

FIGS. 26A and 26B are block diagrams of parallel data communication systems 400 and 400', according to example embodiments of the present invention. Referring to FIG. 26A, the parallel data communication system 400 includes a memory controller 410 and a memory device 420. The memory device 420 receives a command/address signal CA from the memory controller 410 with a first clock signal CA_CLK from the memory controller 410. The memory device 420 performs input/output of the data DQ with a second clock signal DQ_CLK in response to a data write or read command.

In FIG. 26A, the second clock signal DQ_CLK is a free-running clock signal and may have a frequency and/or phase different from that of the first clock signal CA_CLK. When the data write or read command is generated, at least one preamble with adjustable bit pattern and length is used to indicate a start of the parallel data DQ input/output by the memory device 420 similarly as described above for reducing SSN noise.

Referring to FIG. 26B, the parallel data communication system 400' includes a memory controller 530 and a plurality of memory devices 550. For example, the memory devices 550 form a memory module 500. The memory controller 530 transmits and receives N-bits parallel data DQ with each memory device 550 with signals CA, CA_CLK, and DQ_CLK, similarly as described with reference to FIG. 26A. In addition, at least one preamble with adjustable bit pattern and length is used to indicate a start of the parallel data DQ input/output by each memory device 550 similarly as described above for reducing SSN noise. For example in FIG. 26B, the memory devices 550 are formed into groups each with a respective length and bit patterns of the preambles.

Figure 27A:
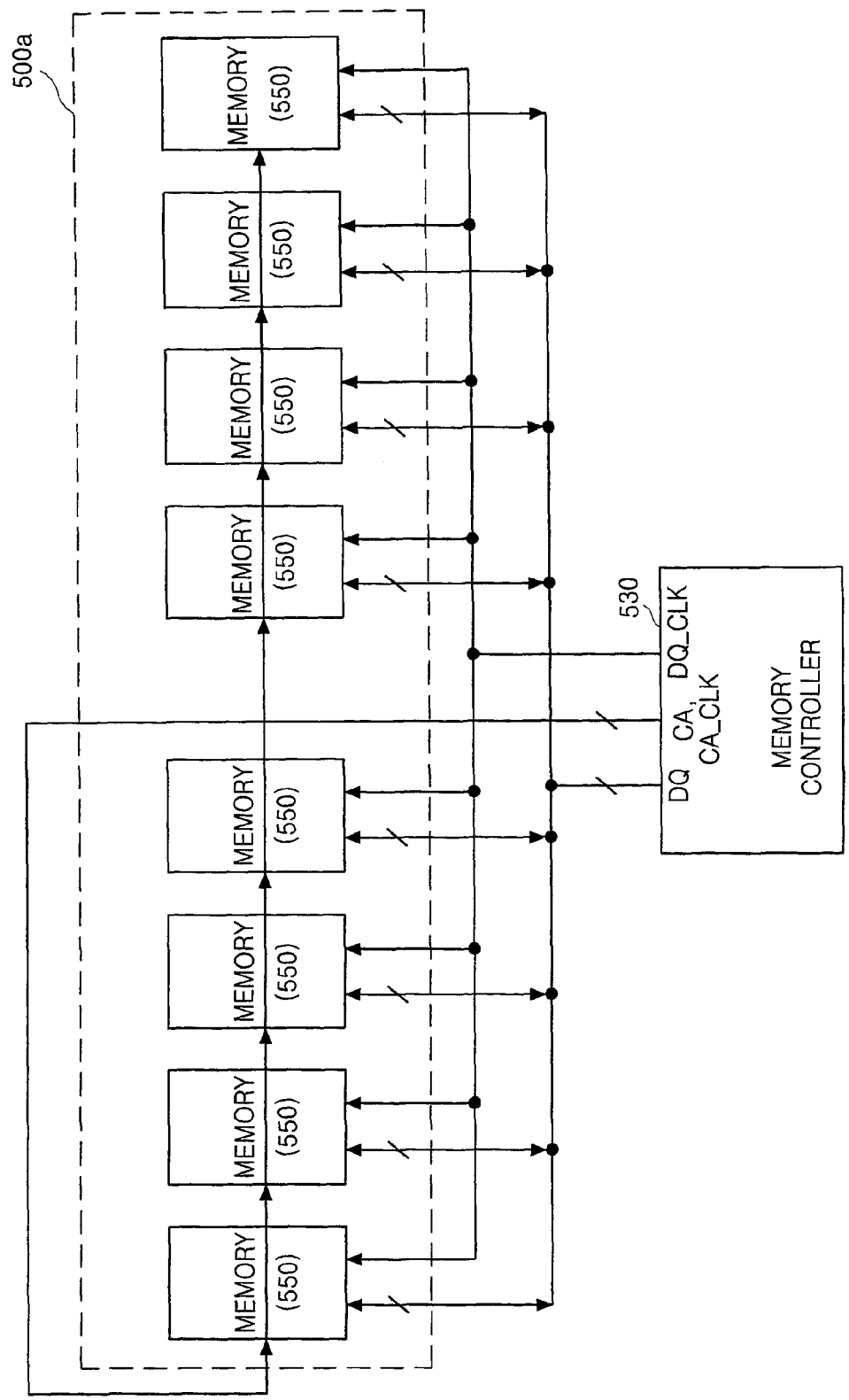
FIGS. 27A, 27B, and 27C are block diagrams of various memory modules, according to example embodiments of the present invention.
Figure 27B:
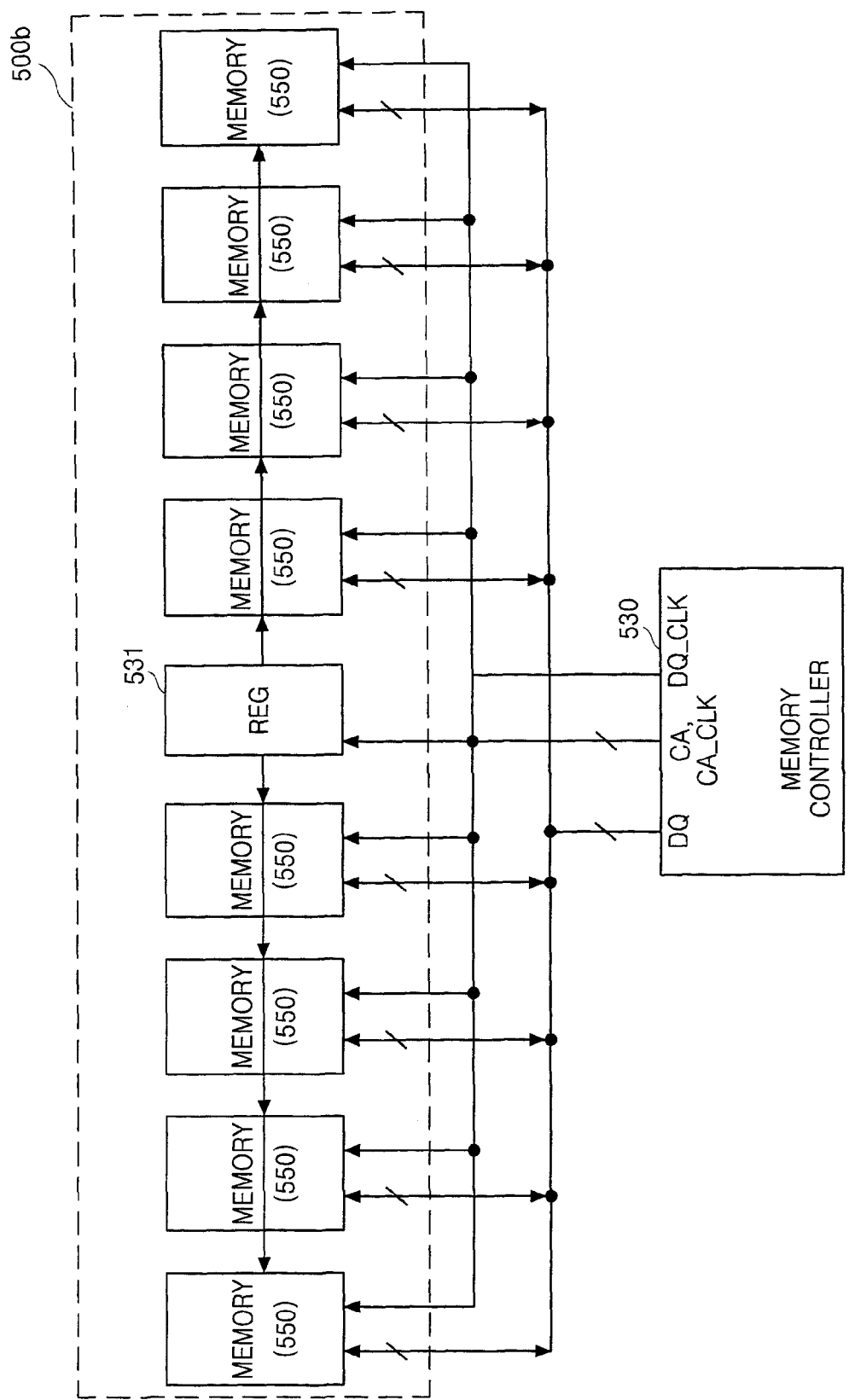
Figure 27C:
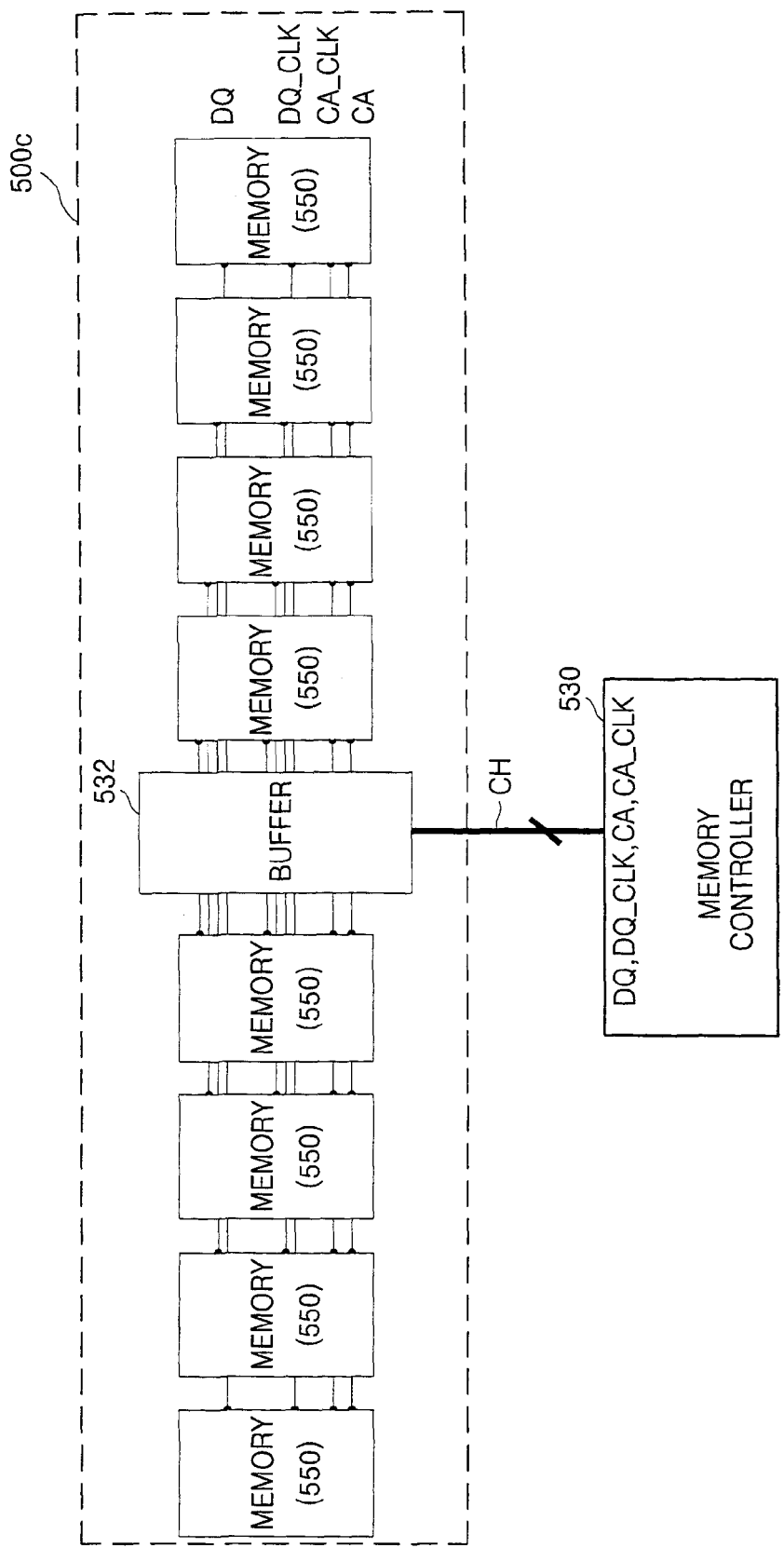

FIGS. 27A, 27B, and 27C show block diagrams of example configurations of memory modules according to example embodiments of the present invention. FIG. 27A shows a memory module 500a that is an example of an unbuffered dual in-line memory module (UDIMM).

The memory module 500a includes a plurality of semiconductor memory devices 550 that receive the command/address signal CA in response to the first clock signal CA_CLK from the memory controller 410. The memory devices 550 input/output the data DQ in response to the second clock signal DQ_CLK. The memory module 500a also includes data lines connected to each of the memory devices 550 for providing input/output paths for the data DQ. The memory module 500a further includes command/address lines for transmitting the command/address signal CA to each memory device 550.

The memory module 500a also includes clock lines for supply of the first and second clocks signals CA_CLK and DQ_CLK to each memory device 550. In FIG. 27A, the first and second clocks signals CA_CLK and DQ_CLK, the command/address signal CA, and the data DQ are communicated between the memory controller 410 and the memory devices 550 without passing such signals through a separate buffer. In FIG. 27A, the paths of the first clock signal CA_CLK and the command/address signal CA are different from that of the second clock signal DQ_CLK and the data DQ.

FIG. 27B shows a memory module 500b that is an example of a registered dual in-line memory module (RDIMM). The first clock signal CA_CLK and the command/address signal CA are provided from the memory controller 530 to each memory device 550 via a register/PLL circuit REG 531. The second clock signal DQ_CLK and the data DQ are communicated with each memory device 550 without passing through the register/PLL circuit REG 531.

The register/PLL circuit REG 531 may include a register for buffering the command/address signal CA and a PLL circuit for generating the first clock signal CA_CLK. In some cases, the register/PLL circuit REG 531 may be implemented on a chipset not in the memory module 500b. In that case, the register/PLL circuit REG 531 may be removed from the memory module 500b.

FIG. 27C shows a memory module 500c that is an example of a fully buffered DIMM (FBDIMM) having a buffer BUFFER 532. The memory module 500c with the buffer BUFFER 532 is connected to the memory controller 530 via a single channel CH and is capable of communicating with the memory controller 530 via only the buffer 532 connected to the channel CH. That is, all semiconductor memory devices 550 on the memory module 500c receive the clock signals CA_CLK and DQ_CLK, the command/address signal CA, and the data DQ from the memory controller 530, and output the data DQ to the memory controller 530, only via the buffer 532 connected to the channel CH.

FIGS. 28A, 28B, 28C, and 28D show memory systems having at least one of the memory module configurations of FIGS. 27A, 27B, and 27C, according to example embodiments of the present invention. FIG. 29 illustrates a signal path in the memory system of FIG. 28D.

Figure 28A:
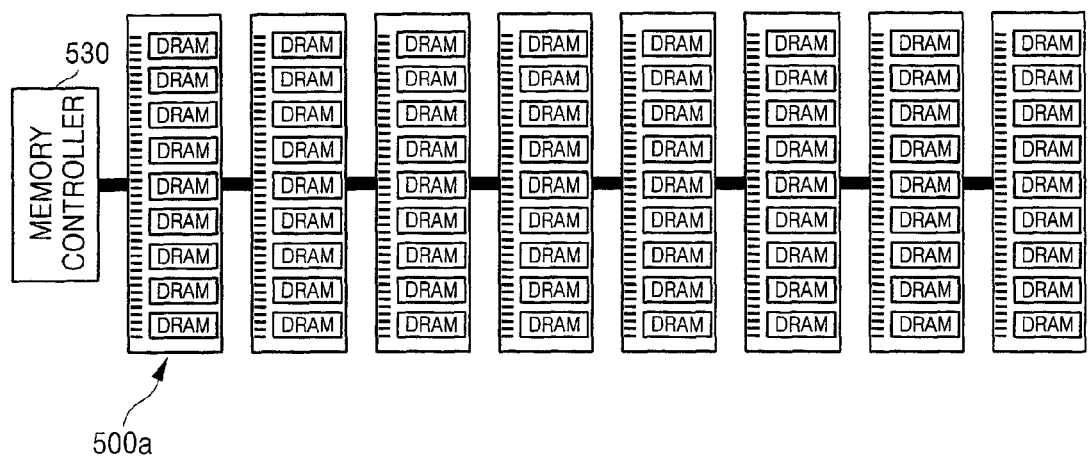
FIGS. 28A, 28B, 28C, and 28D show example memory systems each being configured with at least one of the memory modules of FIGS. 27A, 27B, or 27C, according to example embodiments of the present invention.
Figure 28B:
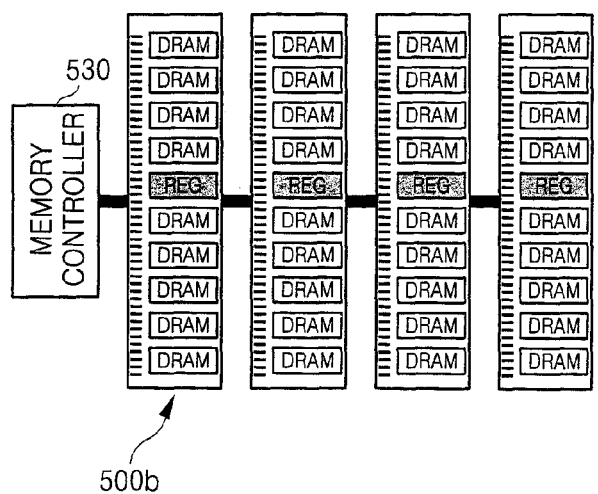
Figure 28C:
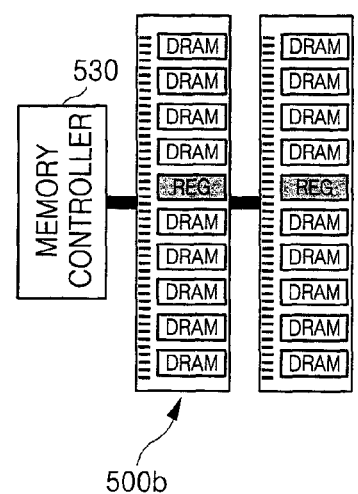
Figure 29:
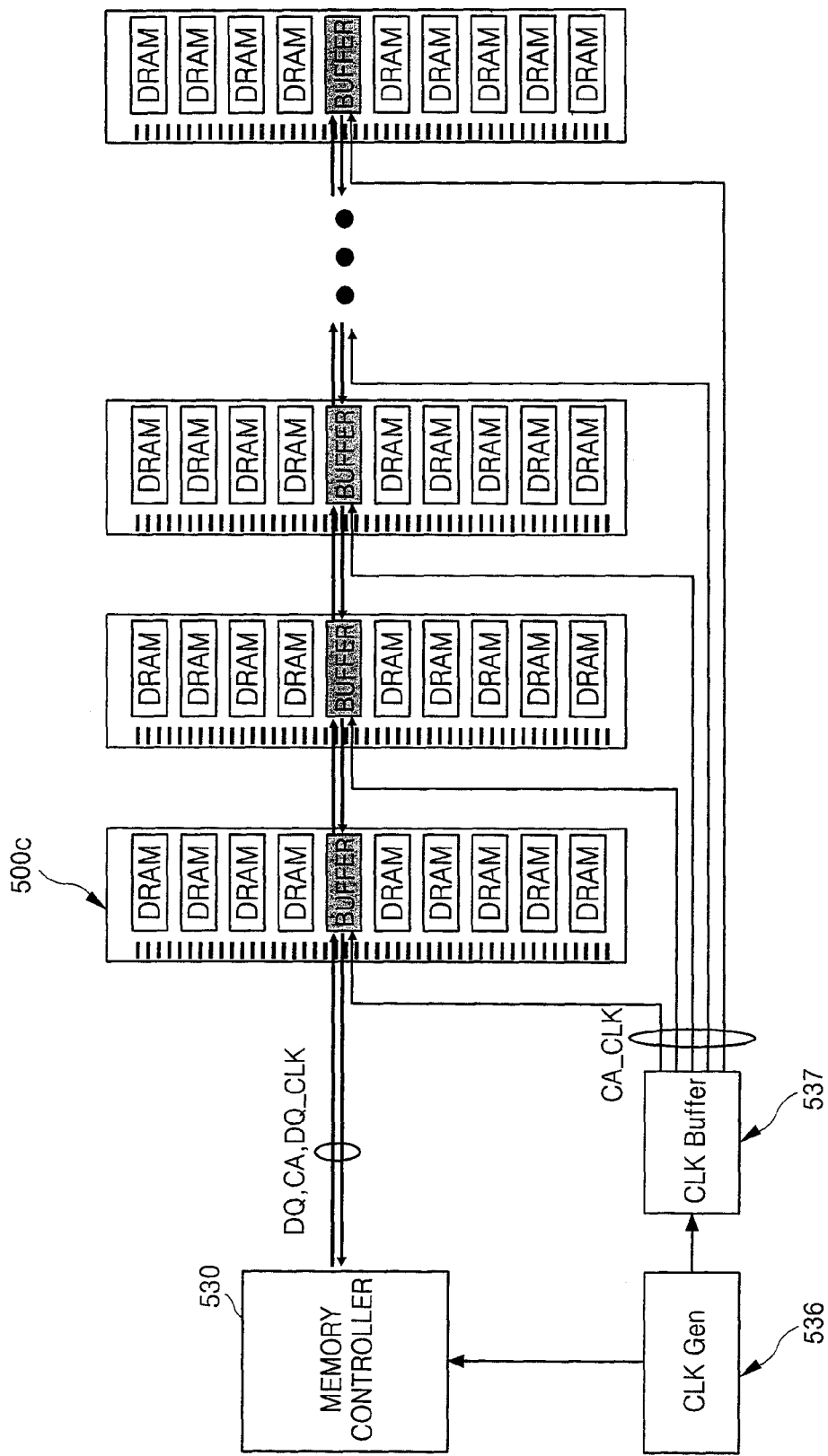
FIG. 29 shows example signal paths in the memory system of FIG. 28D, according to an example embodiment of the present invention.

For example, FIG. 28A shows the memory controller 530 connected to each of a plurality of memory modules 500a according to the configuration of the unbuffered dual in-line memory module (UDIMM) as described in reference to FIG. 27A. FIGS. 28B and 28C show the memory controller 530 connected to each of a plurality of memory modules 500b according to the configuration of the registered dual in-line memory module (RDIMM) as described in reference to FIG. 27B.

Figure 28D:
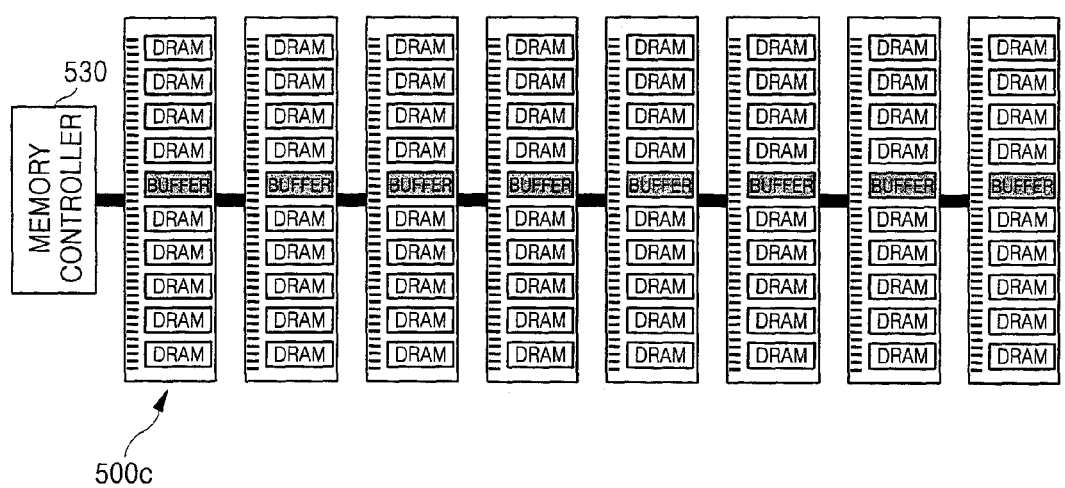

FIGS. 28D shows the memory controller 530 connected to each of a plurality of memory modules 500c according to the configuration of the fully buffered DIMM (FBDIMM) as described in reference to FIG. 27C. FIG. 29 is similar to FIG. 28D, but illustrates a clock generator 536 and a clock buffer 537 formed outside of the memory controller 530 for providing the CA_CLK signal to the memory modules 500c. The memory controller 530 in FIG. 29 communicates the data DQ, the command/address CA, and the DQ_CLK signal via respective buffers of the memory modules 500c.

In the example embodiments of FIGS. 27A, 27B, 27C, 28A, 28B, 28C, 28D, and 29, the memory controller 530 transmits/receives parallel data with each memory device 550 using preambles having bit patterns and lengths that are flexibly adjustable for indicating the start of parallel data similarly as described above. For example, the memory devices 550 may be organized into at least one group with each group having at least one of the memory devices 550, and the length and bit patterns of the preambles may be independently programmed according to such groups.

The foregoing is by way of example only and is not intended to be limiting. For example, any number of elements as illustrated and described herein is by way of example only. The present invention is limited only as defined in the following claims and equivalents thereof.

What is claimed is:
1. A memory controller, comprising:
 a preamble unit for generating or detecting a first preamble having a first length for a first data line, and generating or detecting a second preamble having a second length for a second data line;

wherein the first length is different from the second length, and wherein data on the first and second data lines form parallel data; and a data interface for communicating a first data with said first preamble via said first data line and for communicating a second data with said second preamble via said second data line, and wherein the data interface communicates the first preamble before the first data on the first data line, and wherein the data interface communicates the second preamble before the second data on the second data line, and wherein the first and second data are separate data that are separately communicated on the first and second data lines that are separate data lines.

2. The memory controller of claim 1, wherein the memory controller is a DRAM controller for controlling a DRAM.

3. The memory controller of claim 1, wherein the preamble unit is a preamble generator in a transmitter, and wherein the data interface includes:

a data output circuit for transmitting said first preamble before said first data via said first data line, and for transmitting said second preamble before said second data via said second data line, and wherein the memory controller further comprises:

a data storage unit that generates the first and second data; and a programmable unit having the first and second lengths stored therein.

4. The memory controller of claim 1, wherein the preamble unit is a preamble detector in a receiver for detecting the first and second preambles, and wherein the data interface includes:

a data input circuit for receiving said first data with said first preamble via said first data line and said second data with said second preamble via said second data line, and wherein the memory controller further comprises:

a data storage unit for having the first and second data written therein; and a programmable unit having the first and second lengths stored therein.

5. A memory device, comprising:

a programmable unit that is configured to be programmed with first preamble information for a first data line and second preamble information for a second data line;

a preamble unit for generating or detecting a first preamble according to the first preamble information and generating or detecting a second preamble according to the second preamble information; and a data interface for communicating first data with said first preamble via said first data line and communicating second data with said second preamble via said second data line, wherein said first and second data on the first and second data lines form parallel data, and wherein the data interface communicates the first preamble before the first data on the first data line, and wherein the data interface communicates the second preamble before the second data on the second data line, and wherein the first and second data are separate data that are separately communicated on the first and second data lines that are separate data lines.

6. The memory device of claim 5, wherein the memory device is a DRAM.

7. The memory device of claim 5, wherein the memory device is a transmitter, and wherein the preamble unit is a preamble generator for generating said first and second preambles according to the first and second preamble information that indicates at least one of a respective length and a respective pattern of said first and second preambles, and wherein the data interface includes a data output circuit for transmitting said first and second preamble before said first and second data via said first and second data lines, respectively, after reading said data from a data storage unit.

8. The memory device of claim 5, wherein the memory device is a receiver, and wherein the data interface includes a data input circuit for receiving said first and second preambles and said first and second data via said first and second data lines, respectively, and wherein the preamble unit includes a preamble detector for detecting said first and second preambles according to the first and second preamble information that indicates at least one of respective length and respective pattern of said first and second preambles.

9. A method for communicating data, comprising:

generating or detecting a first preamble having a first length for a first data line;

generating or detecting a second preamble having a second length for a second data line, wherein the first length is different from the second length, and wherein data on the first and second data lines form parallel data;

communicating a first data with said first preamble via said first data line; and communicating a second data with said second preamble via said second data line, wherein the first preamble is communicated before the first data on the first data line, and wherein the second preamble is communicated before the second data on the second data line, and wherein the first and second data are separate data that are separately communicated on the first and second data lines that are separate data lines.

10. The method of claim 9, further comprising:

transmitting said first preamble before said first data via said first data line; and transmitting said second preamble before said second data via said second data line.

* * * * *